(12) United States Patent
Yamamoto et al.

(10) Patent No.: US 6,270,898 B1
(45) Date of Patent: Aug. 7, 2001

(54) TOOL TIP AND BONDING TOOL COMPRISING THE TOOL TIP AND CONTROL METHOD FOR THE BONDING TOOL

(75) Inventors: Katsuko Yamamoto; Takahisa Iguchi; Yoshiaki Kumazawa; Katsuyuki Tanaka; Hiromu Shiomi; Takashi Tsuno; Naoji Fujimori, all of Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/180,981

(22) PCT Filed: May 26, 1997

(86) PCT No.: PCT/IP97/01780

§ 371 Date: Nov. 18, 1998

§ 102(e) Date: Nov. 18, 1998

(87) PCT Pub. No.: WO97/45867

PCT Pub. Date: Dec. 4, 1997

(30) Foreign Application Priority Data

May 27, 1996 (JP) .................................................. 8-132102
Feb. 7, 1997 (JP) .................................................. 9-024943

(51) Int. Cl.[7] .................................................. H01L 21/60
(52) U.S. Cl. .......................... 428/408; 428/141; 428/174; 428/195; 428/209; 428/210; 428/332; 428/446; 428/469; 428/698; 428/704
(58) Field of Search .................................. 428/408, 195, 428/210, 332, 704, 446, 698, 469, 141, 174, 212, 209; 257/77

(56) References Cited

U.S. PATENT DOCUMENTS

| | | | |
|---|---|---|---|
| 5,250,149 | * 10/1993 | Kimoto et al. | 156/612 |
| 5,254,862 | * 10/1993 | Kalyankjumar et al. | 257/77 |
| 5,294,381 | * 3/1994 | Iguchi et al. | 264/25 |
| 5,368,897 | * 11/1994 | Kurihara et al. | 427/38 |
| 5,371,383 | * 12/1994 | Miyata et al. | 257/77 |
| 5,488,350 | 1/1996 | Aslam et al. . | |
| 5,491,348 | * 2/1996 | Koyamao et al. | 257/77 |

FOREIGN PATENT DOCUMENTS

| | | |
|---|---|---|
| 4-051534 | 2/1992 | (JP) . |
| 5-067651 | 3/1993 | (JP) . |
| 5-226421 | 9/1993 | (JP) . |
| 5-304191 | 11/1993 | (JP) . |
| 6-037150 | 2/1994 | (JP) . |

OTHER PUBLICATIONS

Hiromu Shiomi et al. "Characterization of Baron–Doped Diamond Epitaxial Films", published by Japanese Journal of Applied Physics, vol. 30, No. 7, Jul., 1991, pp. 1363 to 1366.
T.H.Borst et al., "Electrical characterization of homepitaxial diamond films doped with B, P, Li and Na during crystal growth", in "Diamond and Related materials", published by Elsevier, Paper Presented at Diamond Films '94, Il, Ciocco, Sep. 25–30, 1994, pp. 948–953.

* cited by examiner

*Primary Examiner*—Archene Turner
(74) *Attorney, Agent, or Firm*—W.F. Fasse; W.G. Fasse

(57) ABSTRACT

A conductive polycrystalline diamond film having specific resistance of at least $1 \times 10^{-4}$ Ωcm and less than $1 \times 10^3$ Ωcm, whose film thickness is in the range of at least 0.1 μm and not more than 500 μm, is film-formed by vapor-phase synthesis on a surface employed for pressure bonding, a surface opposite to this surface or at least two side surfaces intersecting with these surfaces on a substrate of a bonding tool tip that is applicable for bonding and packaging a semiconductor chip.

24 Claims, 22 Drawing Sheets

FIG.10 PRIOR ART

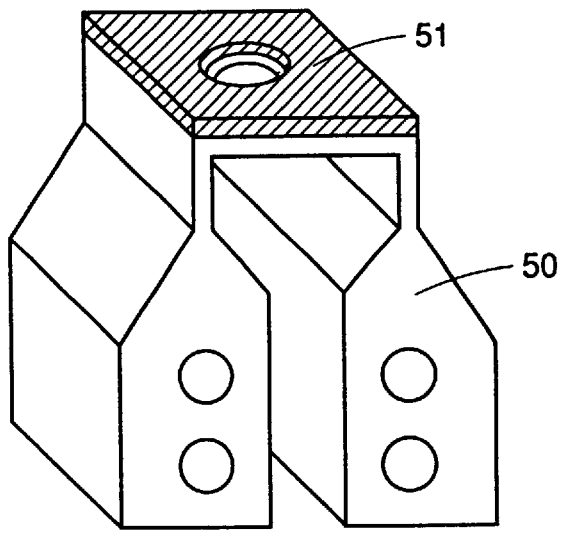

FIG.11

| EVALUATED ITEM | TOOL TIP OF PRESENT INVENTION | TOOL TIP OF CONVENTIONAL FORM |
|---|---|---|
| TEMPERATURE RISE TIME FROM 20°C TO 500°C | 1.2 SECONDS | 6.5 SECONDS |
| COOLING TIME FROM 500°C TO 80°C | 9 SECONDS | 35 SECONDS |
| TEMPERATURE DISTRIBUTION (500°C) | 8°C | 8°C |
| FLATNESS (500°C) | 0.5 μm CONCAVE | 2.5 μm CONCAVE |
| STATE OF TOOL TIP AFTER REPETITIVE HEATING TEST OF 100,000 TIMES | NORMAL IN OBSERVATION WITH ×50 MICROSCOPE | NORMAL IN OBSERVATION WITH ×50 MICROSCOPE |

FIG.12

| | SPECIFIC RESISTANCE Ωcm | BORON CONTENT ppm | FILM THICKNESS μm | CHARACTERISTICS | | | | DURABILITY |
|---|---|---|---|---|---|---|---|---|
| | | | | TEMPERATURE RISE sec | COOLING sec | TEMPERATURE DISTRIBUTION °C | | |
| ① | $7 \times 10^{-5}$ | 55000 | 0.05 | 7 | 30 | 50 | | DETERIORATED |
| ② | $1 \times 10^{-5}$ | 51000 | 2 | 15 | 60 | 40 | | DETERIORATED |
| ③ | $8 \times 10^{-5}$ | 52000 | 600 | TEMPERATURE UNINCREASABLE TO 500°C | | | | |
| ④ | $1 \times 10^{-3}$ | 5000 | 0.05 | 50 | 600 | 25 | | UNCHANGED |
| ⑤ | $1 \times 10^{-4}$ | 30000 | 0.1 | 1.5 | 10 | 20 | | UNCHANGED |
| ⑥ | $1 \times 10^{-2}$ | 200 | 10 | 1.2 | 9 | 8 | | UNCHANGED |
| ⑦ | $1 \times 10^{1}$ | 500 | 500 | 5 | 15 | 6 | | UNCHANGED |
| ⑧ | $1 \times 10^{-1}$ | 1000 | 600 | 10 | 40 | 10 | | UNCHANGED |
| ⑨ | $1 \times 10^{4}$ | 80 | 0.05 | TEMPERATURE UNINCREASABLE TO 500°C | | | | |
| ⑩ | $3 \times 10^{4}$ | 60 | 20 | TEMPERATURE UNINCREASABLE TO 500°C | | | | |
| ⑪ | $5 \times 10^{4}$ | 50 | 1000 | TEMPERATURE UNINCREASABLE TO 500°C | | | | |

FIG.15

| EVALUATED ITEM | TOOL TIP OF PRESENT INVENTION | TOOL TIP OF CONVENTIONAL FORM |
|---|---|---|
| TEMPERATURE RISE TIME FROM 20°C TO 600°C | 1.1 SECONDS | 8.5 SECONDS |
| COOLING TIME FROM 600°C TO 80°C | 5 SECONDS | 50 SECONDS |
| TEMPERATURE DISTRIBUTION (600°C) | 8°C | 8°C |
| FLATNESS (600°C) | 0.2 μm CONCAVE | 3.5 μm CONCAVE |
| STATE OF TOOL TIP AFTER REPETITIVE HEATING TEST OF 200,000 TIMES | NORMAL IN OBSERVATION WITH X50 MICROSCOPE | OXIDATION OF SOLDER LAYER WAS RECOGNIZED IN OBSERVATION WITH X50 MICROSCOPE |

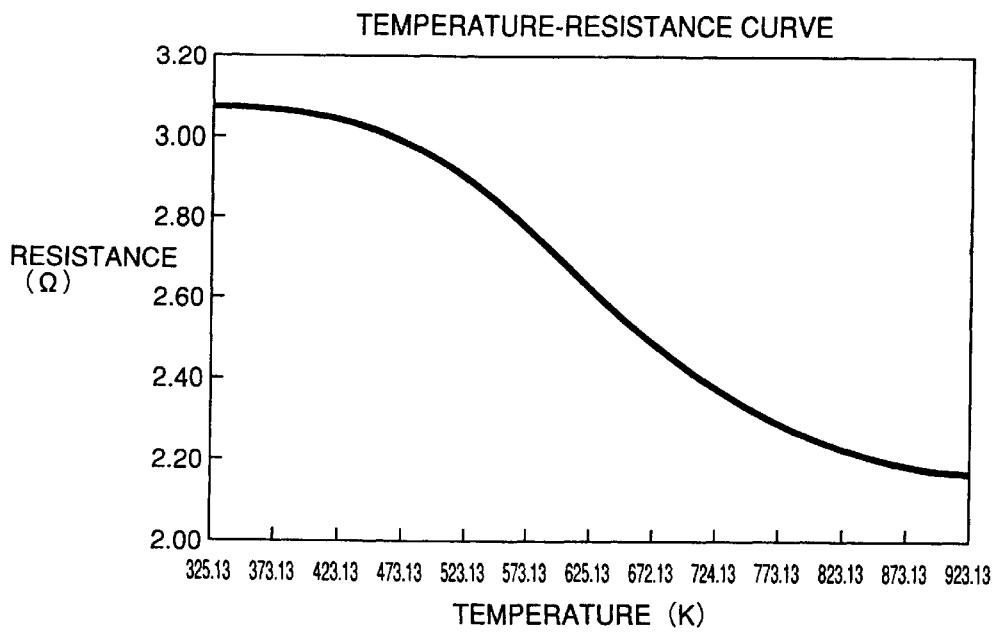

| EVALUATED ITEM | TOOL TIP OF PRESENT INVENTION |
|---|---|
| TEMPERATURE RISE TIME FROM 20°C TO 500°C | 1.3 SECONDS |
| COOLING TIME FROM 500°C TO 80°C | 9 SECONDS |
| TEMPERATURE DISTRIBUTION (500°C) | 8°C |
| FLATNESS (500°C) | 0.7 μm CONCAVE |
| STATE OF TOOL TIP AFTER REPETITIVE HEATING TEST OF 100,000 TIMES | NORMAL IN OBSERVATION WITH X50 MICROSCOPE |

FIG.21

| EVALUATED ITEM | TOOL TIP OF PRESENT INVENTION |
|---|---|
| TEMPERATURE RISE TIME FROM 20°C TO 500°C | 0.8 SECONDS |
| COOLING TIME FROM 500°C TO 80°C | 9.5 SECONDS |
| TEMPERATURE DISTRIBUTION (500°C) | 6°C |
| FLATNESS (500°C) | 0.5 μm CONCAVE |
| STATE OF TOOL TIP AFTER REPETITIVE HEATING TEST OF 100,000 TIMES | NORMAL IN OBSERVATION WITH X50 MICROSCOPE |

FIG.25

| EVALUATED ITEM | TOOL OF PRESENT INVENTION |
|---|---|
| TEMPERATURE RISE TIME FROM 20°C TO 500°C | 1.3 SECONDS |
| COOLING TIME FROM 500°C TO 80°C | 10 SECONDS |
| TEMPERATURE DISTRIBUTION (500°C) | 8°C |
| FLATNESS (500°C) | 0.1 μm |
| STATE OF TOOL AFTER REPETITIVE HEATING TEST OF 100,000 TIMES | NORMAL IN OBSERVATION WITH X50 MICROSCOPE |

TOOL TIP AND BONDING TOOL COMPRISING THE TOOL TIP AND CONTROL METHOD FOR THE BONDING TOOL

TECHNICAL FIELD

The present invention relates to a tool tip and a bonding tool comprising the tool tip and a control method for the bonding tool, and more specifically, it relates to improvements of structures of a tool tip employed in a step of bonding electrodes of a semiconductor chip to lead wires or external terminals and a bonding tool comprising the tool tip and a control method for the bonding tool.

BACKGROUND TECHNIQUE

Generally in packaging of a semiconductor chip, it is necessary to carry out a step of connecting electrodes formed on the semiconductor chip and external terminals or lead wires with each other. In this step, the electrodes of the semiconductor chip and the external terminals or the like are connected with each other with interposition of a brazing filler metal of gold or tin, an anisotropic conductive film or resin such as a conductive adhesive.

At this time, a tool tip is employed for locating and pressing the semiconductor chip on and against prescribed positions of the external terminals or the like and directly heating the brazing filler metal of gold or tin or the anisotropic conductive film or indirectly heating the same through the semiconductor chip.

For the tool tip, there are two types of heating systems, namely a constant heat system of regularly heating the same to a required temperature and a pulse heat system of instantaneously heating the same only as needed in response to the bonding specification of the semiconductor chip.

In either heating system, high accuracy is required of a pressing surface on the forward end of the tool tip as a consequence of high densification of packaging of the semiconductor chip. Since temperature distribution of the pressing surface in heating is homogeneous and flatness of the pressing surface is excellent from this requirement and the homogeneity of the temperature distribution and the flatness can be maintained over a long time, a technique of sticking a diamond film to the pressing surface on the forward end of the tool tip is employed.

In case of the pulse heat system, however, there is such a problem that heat response is inferior as compared with a tool tip consisting of a pure metal such as nichrome, molybdenum, inconel or stainless steel to which no diamond film is stuck since temperature rise of the diamond film stuck to the pressing surface on the forward end results from heat transfer from a tool base material.

Namely, the tool tip employing a diamond film requires a long time as compared with the tool tip consisting of a pure metal for heating and cooling the pressing surface on the forward end of the tool tip to prescribed temperatures in response to current pulses. Therefore, it is difficult to reduce the time required for single bonding of the semiconductor chip.

In relation to this point, there has been proposed a method of making a diamond film synthesized by a vapor-phase synthetic method on a pressing surface on a forward end of a tool tip conductive so that the diamond film itself will generate heat, and the problem related to heat response is solved in Japanese Patent Laying-Open Gazette No. 5-304191 or Japanese Patent Laying-Open Gazette No. 5-226421.

Also U.S. Pat. No. 5,488,350 proposes to employ a conductive diamond film synthesized by a vapor-phase synthetic method as a heat generator.

The technique disclosed in the aforementioned Japanese Patent Laying-Open Gazette No. 5-304191, however, employs a structure in which the diamond film is brazed to a tool base material of a metal whose coefficient of thermal expansion is different. Hence, there are such problems that distortion takes place in the diamond film due to difference of thermal expansion in temperature rise and flatness of the pressing surface on the forward end of the tool tip is hard to ensure.

According to the technique disclosed in the aforementioned Japanese Patent Laying-Open Gazette No. 5-226421, there are such problems that the cost for the tool tip increases and the tool tip is easy to break in handling thereof since the material used for the tool tip itself is diamond.

According to the technique disclosed in U.S. Pat. No. 5,488,350, further, the conductive diamond film is formed in a pattern similarly to a heater wire, i.e., the conductive diamond film is selectively grown in order to homogenize temperature distribution of the heat generator. Therefore, $SiO_2$ or the like is formed on a substrate or insulating diamond in a reverse pattern shape relative to the pattern of the conductive diamond film through sputtering or the like, for forming the conductive diamond film by employing this as a mask. However, it is necessary to carry out this formation process by controlling the film thickness of $SiO_2$ with high accuracy. Further, there are such problems that a step of dissolving/removing $SiO_2$ is required after forming the conductive diamond film and the tool tip manufacturing cost increases.

SUMMARY OF THE INVENTION

An object of the present invention is to provide a tool tip maintaining the flatness of a flat surface on a forward end of the tool tip with high accuracy, in which handling and attachment/detachment to/from equipment is easy and a manufacturing method of a heat generating part is simpler, and to provide a bonding tool comprising the tool tip and a control method for the bonding tool, which have been proposed in order to solve such problems.

A tool tip in one aspect based on the present invention has, in a tool tip employing a vapor-phase synthesized conductive polycrystalline diamond film for a forward end portion of a bonding tool for pressure bonding, a substrate mainly composed of at least one material selected from a group consisting of a diamond polycrystal, Si, SiC, AlN, $Si_3N_4$ and single-crystalline diamond, a conductive polycrystalline diamond film, applied to a surface employed for pressure bonding, a surface opposite to this surface or at least two side surfaces intersecting with these surfaces on the aforementioned substrate, which is in the ranges of at least $1 \times 10^{-4}$ $\Omega$cm and less than $1 \times 10^3$ $\Omega$cm in specific resistance and at least 0.1 $\mu$m and not more than 500 $\mu$m in film thickness and a metal film applied onto the aforementioned conductive polycrystalline diamond film for introducing power into the aforementioned conductive polycrystalline diamond film.

Regarding the conductive polycrystalline diamond film, it is difficult to form the same as a continuous film whose film thickness is homogeneous if the film thickness is not more than 0.1 $\mu$m. Further, in-plane temperature distribution abruptly deteriorates if the film thickness is not more than 0.1 $\mu$m, since a local heating value depends on the film thickness of conductive polycrystalline diamond.

If the film thickness is in excess of 500 $\mu$m, on the other hand, the electric energy required for temperature rise increases since the heat capacity of the tool tip increases. Consequently, the temperature rise characteristic and the cooling characteristic of the tool tip become inferior. Further, the cost for forming the conductive polycrystalline diamond film increases while warping of the material increases due to stress of the conductive polycrystalline film. In addition, a polishing time for attaining flatness of the surface of the conductive polycrystalline diamond film abruptly lengthens and the working cost for the surface of the conductive polycrystalline diamond film increases.

For the above reasons, it is possible to obtain a conductive polycrystalline diamond film which is excellent in flatness and temperature rise/cooling characteristics with a low film forming cost by rendering the film thickness of the conductive polycrystalline diamond at least 0.1 $\mu$m and not more than 500 $\mu$m.

As to the specific resistance of the conductive polycrystalline diamond film, contact resistance with the metal film increases to readily spark in energization if the specific resistance of the conductive polycrystalline diamond is high. In order to avoid this, therefore, specific resistance of not more than $1\times10^3$ $\Omega$cm is necessary. When an impurity content becomes high enough to achieve a specific resistance of not more than $1\times10^{-4}$ $\Omega$cm, on the other hand, it causes deterioration of the conductive polycrystalline diamond film and deteriorates characteristics such as heat conductivity, abrasion resistance and the like.

In order to quickly increase the temperature to a prescribed level in the tool tip, on the other hand, it is necessary to apply power of about 600 W to 1 KW to the tool tip with a power source of 100 V–20 A capacity. In consideration of the film thickness of the aforementioned conductive polycrystalline diamond, therefore, it is preferable that the specific resistance is at least $1\times10^{-4}$ $\Omega$cm and not more than $1\times10^1$ $\Omega$cm.

In case of structuring the conductive polycrystalline diamond film from at least two types of films whose contents of boron differ from each other, for example, forming a conductive polycrystalline diamond film whose content of boron is high on the aforementioned substrate side and forming a conductive polycrystalline diamond whose content of boron is low on this film, the change of the specific resistance value must be less than 0.1 $\Omega$cm with film thickness change of several $\mu$m resulting from polishing in the upper layer conductive polycrystalline diamond film whose content of boron is low. Consequently, it is preferable that the specific resistance of the conductive polycrystalline diamond is at least $1\times10^1$ $\Omega$cm and less than $1\times10^3$ $\Omega$cm.

For the above reasons, it is most preferable to have specific resistance of at least $1\times10^{-4}$ $\Omega$cm and less than $1\times10^3$ $\Omega$cm in the conductive polycrystalline diamond film.

By thus employing the conductive polycrystalline diamond film having the aforementioned film thickness and specific resistance, it is achieved that this conductive polycrystalline diamond film itself resistively generates heat. Further, this conductive polycrystalline diamond film is excellent in heat conductivity, and the surface employed for pressure bonding can obtain homogeneous temperature distribution. In addition, it causes heat generation of only a part of the conductive polycrystalline diamond film coming into contact with a semiconductor chip, whereby the heat capacity reduces and heat response becomes quicker.

Further, only a necessary part may be heated, to hardly exert influence on the periphery by heat. In addition, no warping of the conductive polycrystalline diamond film takes place in temperature rise since the same is not in a brazed structure relative to the substrate dissimilarly to the conventional tool tip.

In the aforementioned aspect, preferably at least one or more suction through holes are provided from the aforementioned surface employed for the aforementioned pressure bonding to the surface opposite to the aforementioned surface.

Thus, by providing the suction through hole(s) on the surface employed for pressure bonding, carriage of the semiconductor chip becomes easy. Further, the pressing surface on the forward end of the tool tip, i.e., the surface employed for pressure bonding and the surface opposite thereto are provided to be parallel to each other, whereby it becomes possible to readily perform adjustment of the parallelism in mounting to external equipment.

In the aforementioned aspect, the aforementioned conductive polycrystalline diamond film is a film formed by addition of an impurity, and boron is employed for this impurity. On the other hand, i.e. alternatively, the aforementioned conductive polycrystalline diamond film is a film formed by introduction of a fault, and this fault has an sp2 structure.

Preferably in the aforementioned aspect, the aforementioned conductive polycrystalline diamond film is so provided that its surface roughness is at least 0.1 $\mu$m and not more than 10 $\mu$m. Thus, by rendering the surface roughness at least 0.1 $\mu$m and not more than 10 $\mu$m, a conductor film electrode on a rear surface of the tool tip and a metal electrode of a feed holder provided in the exterior are brought into contact by vacuum suction and energized. Therefore, occurrence of a small spark can also be suppressed by increasing contact areas of the tool tip and the metal electrode and improving the contact state. Further, heat transfer from the tool tip to a feed member is improved and cooling becomes quicker.

In the aforementioned aspect, preferably it further has a polycrystalline diamond film which is at least $10^5$ $\Omega$cm in specific resistance and at least 1 $\mu$m and not more than 1000 $\mu$m in film thickness on the outermost layer of the pressing surface. Thus, it becomes possible to prevent conduction to the packaged semiconductor chip and dielectric breakdown of the semiconductor chip beforehand.

In the aforementioned aspect, preferably the aforementioned surface of the substrate employed for pressure bonding and the surface opposite to this surface are parallel to each other, and are so provided that the parallelism thereof is within 0.1 nm with reference to the aforementioned surface employed for pressure bonding. Thus, it becomes possible to perform packaging of the semiconductor chip readily and in high accuracy.

Preferably in the aforementioned aspect, boron of at least 100 ppm and not more than 50000 ppm is added to the aforementioned conductive polycrystalline diamond film. If the boron content is in excess of 50000 ppm, heat conductivity which is a characteristic of diamond deteriorates. Further, it becomes difficult to carry out the synthesis while homogeneously controlling the content. Since the heating value depends on the content of boron, temperature distribution in the tool tip surface deteriorates if the boron content is heterogeneous. If the boron content is not more than 100 ppm, a necessary specific resistance value cannot be obtained.

For the above reasons, it becomes possible to obtain a conductive polycrystalline diamond film in the aforementioned most preferable state by adding boron of at least 100 ppm and not more than 50000 ppm.

In the aforementioned aspect, preferably the aforementioned conductive polycrystalline diamond film is formed by introducing a fault having an sp2 structure, and so provided that the ratio (sp2/sp3) of the maximum values of sp2 and sp3 peaks of a Raman spectrum is at least 0.5 and not more than 10.

When the introduction quantity of the fault of the sp2 structure into the conductive polycrystalline diamond film increases, the specific resistance value decreases. While it is difficult to quantitatively know the fault density of the sp2 structure introduced into the conductive polycrystalline diamond film, it is possible to qualitatively know the fault density of the sp2 structure from the ratio of peak intensity of a spectrum of 1333 $cm^{-1}$ resulting from an sp3 structure of diamond and peak intensity of a broad spectrum in the vicinity of 1540 $cm^{-1}$ resulting from the sp2 structure. Therefore, no preferable specific resistance is obtained although the film quality is excellent if this peak intensity ratio is less than 0.5 since the fault density is small, while the film quality of diamond deteriorates and the desired performance is not obtained if it exceeds 10.

For the above reasons, a conductive polycrystalline diamond film in a more preferable state is obtained by rendering the ratio (sp2/sp3) of the maximum values of the sp2 and sp3 peaks of the Raman spectrum at least 0.5 and not more than 10.

Preferably in the aforementioned structure, the aforementioned conductive polycrystalline diamond film includes at least two layers of films, and the aforementioned outermost surface layer is any of at least one metal material selected from a group consisting of Au, Pt, Ag, Ni, Ta and Cr, or an AgPd alloy, a Pt—Ir alloy, or an oxide containing Ag and at least one or more elements selected from a group consisting of Gd, In, Sn, Zn and Cu, or a metal carbide containing Ag and W.

Thus, it is possible to obtain a conductive polycrystalline diamond film which is strong in oxidation resistance under a high temperature and excellent in deposition resistance, abrasion resistance and insulation recoverability.

In the aforementioned aspect, preferably at least four portions of independent metal layers are further provided on an outer peripheral portion of the tool tip, in order to supply power to an effective area outer peripheral portion of the surface employed for pressure bonding on the aforementioned conductive polycrystalline diamond film. Thus, it becomes possible to further homogenize the in-plane temperature distribution of the tool tip.

The bonding tool based on the present invention comprises, in a bonding tool employing vapor-phase synthesized polycrystalline diamond on a forward end portion thereof for pressure bonding, a tool tip having a substrate mainly composed of at least one material selected from a group consisting of a diamond polycrystal, Si, SiC, AlN, $Si_3N_4$ and single-crystalline diamond, a vapor-phase synthesized conductive polycrystalline diamond film applied to a surface employed for pressure bonding, a surface opposite to this surface or at least two side surfaces intersecting with these surfaces on the aforementioned substrate, and a metal film applied onto the aforementioned vapor-phase synthesized conductive polycrystalline diamond film for supplying power to the aforementioned vapor-phase synthesized conductive polycrystalline diamond film, and a feed holder having a metal electrode for feeding electricity to this tool tip and a ceramic base supporting this metal electrode.

Thus, by comprising the feed holder for feeding electricity to the tool tip, it becomes possible to mount the bonding tool in the present invention without making alterations in an external device for mounting the bonding tool.

Preferably in the aforementioned aspect, the aforementioned feed holder has a vacuum suction groove for sucking the aforementioned tool tip, at least one suction through hole communicating with this vacuum suction groove, and conductor films provided on at least two portions for supplying power to the said tool tip, and has an insulating ceramic base in which flatness of a surface of the aforementioned ceramic base coming into contact with the aforementioned tool tip is less than 3 $\mu$m, a ceramic base which is low in heat conductivity and has an insulation property, and a metal base covered with a metal film for preventing oxidation on its surface. By employing the feed holder consisting of this structure, it becomes possible to supply stable power to the aforementioned tool tip while reliably holding the aforementioned tool tip, and it becomes possible to provide a bonding tool whose reliability is high.

Preferably in the aforementioned aspect, the conductor films on the aforementioned ceramic base include at least two layers of films, and any of at least one metal selected from a group consisting of Au, Pt, Ag, Ni, Ta and Cr, or an AgPd alloy, a Pt—Ir alloy, or an oxide containing Ag and at least one or more elements selected from a group of Gd, In, Sn, Zn and Cu, or a metal carbide containing Ag and W is employed for the outermost surface layer. Thus, by employing the aforementioned metal for the conductor films, it becomes possible to provide a bonding tool having a feed holder having a high melting point which is strong in oxidation resistance under a high temperature and excellent in deposition resistance, abrasion resistance and insulation recoverability.

The control method for the bonding tool based on the present invention is a control method for a bonding tool having a tool tip formed with a vapor-phase synthesized conductive polycrystalline diamond film on its forward end surface, which measures change of electric resistance of the aforementioned vapor-phase synthesized conductive polycrystalline diamond film and performs temperature control of the bonding tool.

Thus, a voltage applied to the vapor-phase synthesized polycrystalline diamond film and a current value are measured and a resistance value is obtained by measuring the electric resistance of the vapor-phase synthesized conductive polycrystalline diamond film, whereby incorporation of a temperature measuring mechanism into the feed holder provided on the bonding tool becomes unnecessary, for example, and it becomes possible to obtain miniaturization of the bonding tool and an excellent temperature rise characteristic by high temperature response of the bonding tool.

BRIEF DESCRIPTION OF THE DRAWINGS

FIG. 1A is a plan view thereof, FIG. 1B is a front elevational view thereof, and FIG. 1C is a side elevational view thereof

FIG. 4A is a plan view thereof, FIG. 4B is a front elevational view thereof, and FIG. 4C is a bottom plan view thereof.

FIG. 5A is a plan view thereof, FIG. 5B is a front elevational view thereof, and FIG. 5C is a bottom plan view thereof.

FIG. 6A is a sectional view thereof, and FIG. 6B is a bottom plan view thereof.

FIG. 7A is a plan view thereof, FIG. 7B is a front elevational view thereof, and FIG. 7C is a side elevational view thereof.

FIG. 8A is a sectional view thereof, and FIG. 8B is a bottom plan view thereof FIG. 9A is a sectional view thereof, and FIG. 9B is a bottom plan view thereof.

FIG. 10 is a perspective view showing a bonding tool in the prior art as comparative example.

FIG. 11 is a diagram showing characteristic evaluation of the tool tip in Concrete Example 1.

FIG. 12 is a diagram showing characteristics in case of changing the specific resistance value, the film thickness and the boron content of a conductive polycrystalline diamond film in Concrete Example 1.

FIG. 13A is a plan view thereof, FIG. 13B is a front elevational view thereof, and FIG. 13C is a bottom plan view thereof.

FIG. 14A is a sectional view thereof, and FIG. 14B is a bottom plan view thereof FIG. 15 is a diagram showing characteristic evaluation of the tool tip in Concrete Example 2.

FIG. 16 is a diagram showing a resistance curve of the temperature of the tool tip in Concrete Example 2.

FIG. 17A is a plan view thereof, FIG. 17B is a front elevational view thereof, and FIG. 17C is a bottom plan view thereof FIG. 18 is a diagram showing characteristic evaluation of the tool tip in Concrete Example 3.

FIG. 20A is a sectional view thereof, and FIG. 20B is a bottom plan view thereof.

FIG. 21 is a diagram showing characteristic evaluation of the tool tip in Concrete Example 4.

FIG. 22A is a plan view thereof, and FIG. 22B is a sectional view thereof.

FIG. 23A is a sectional view thereof, and FIG. 23B is a bottom plan view thereof.

FIG. 24A is a sectional view thereof, and FIG. 24B is a bottom plan view thereof.

FIG. 25 is a diagram showing characteristic evaluation of the tool tip in Concrete Example 5.

BEST MODES FOR CARRYING OUT THE INVENTION

Embodiments of the bonding tool based on the present invention are now described with reference to the drawings.

Figure 1A:
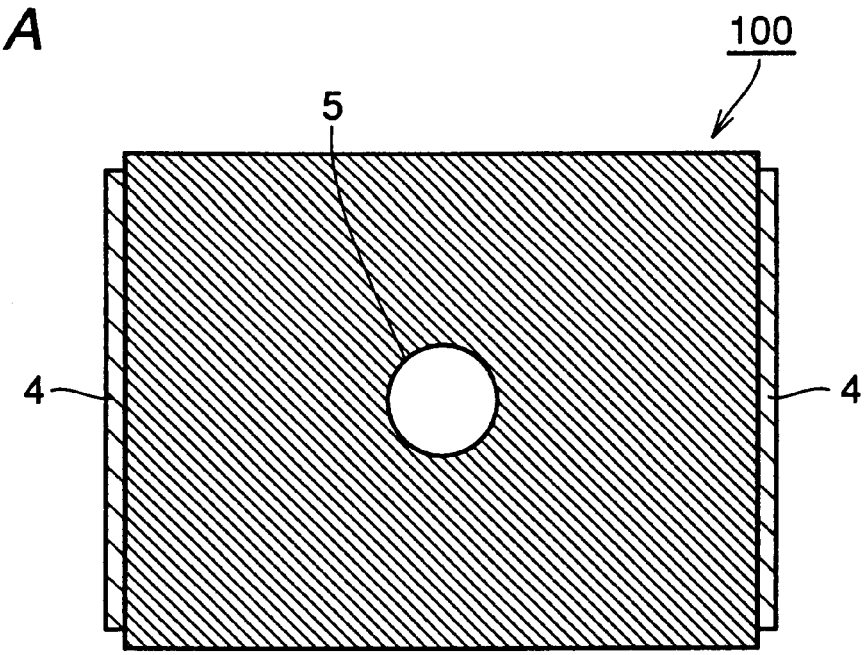
FIG. 1A to FIG. 1C are diagrams showing the structure of a tool tip in the present invention.
Figure 1B:
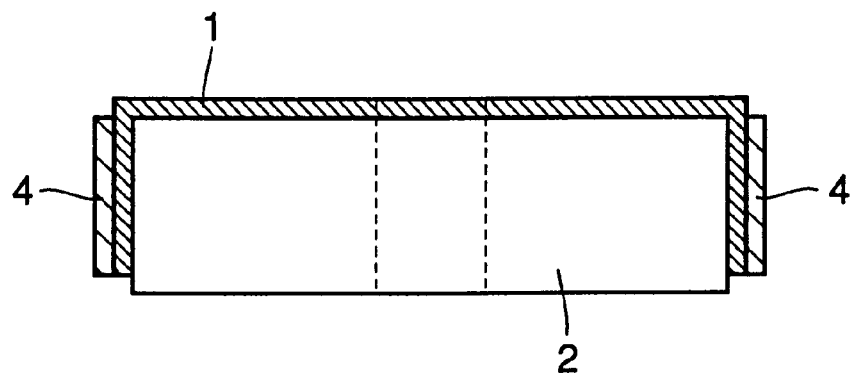
Figure 1C:
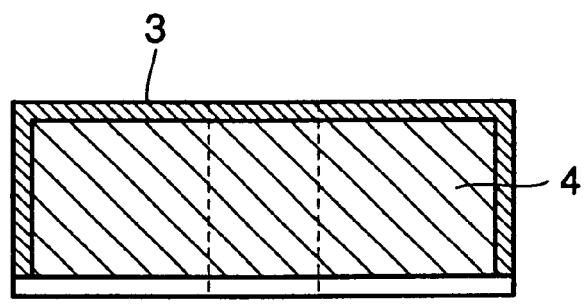

First, the structure of a tool tip forming the bonding tool based on the present invention is described with reference to FIG. 1A to FIG. 1C.

This tool tip 100 is provided with a substrate 2 and a forward end surface 3 for pressure bonding on an upper surface side of this substrate 2. A conductive polycrystalline diamond film 1 having specific resistance in the range of at least $1\times10^{-4}$ Ωcm and less than $1\times10^3$ Ωcm is formed by a vapor-phase synthetic method on the forward end surface 3 of the substrate 2 for pressure bonding and side surfaces intersecting with the plane of this forward end surface 3. This conductive polycrystalline diamond film 1 is applied with its film thickness in the range of 0.1 µm to 500 µm.

Figure 2:
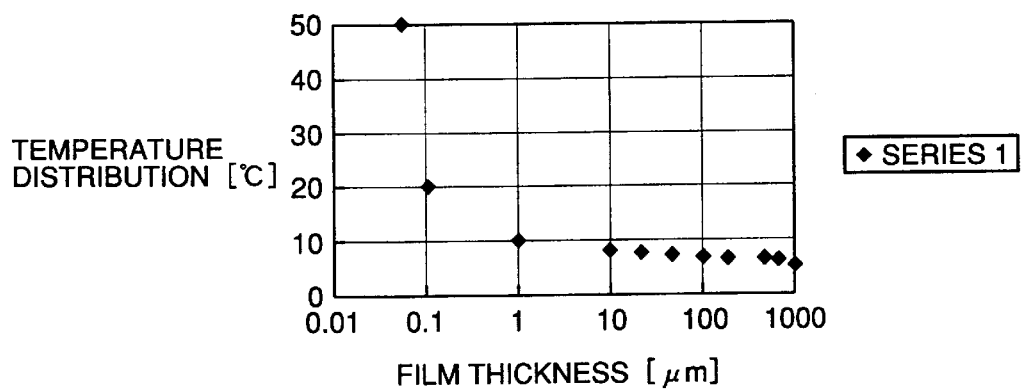
FIG. 2 is a diagram showing the correlation between the film thickness of a conductive polycrystalline diamond film and in-plane temperature distribution.

The film thickness and the specific resistance of the conductive polycrystalline diamond film 1 are now described with reference to FIG. 2 and FIG. 3. If the film thickness of the conductive polycrystalline diamond film 1 is not more than 0.1 µm, it is difficult to form the same as a continuous film with its film thickness homogeneous. Since a local heating value depends on the film thickness of the conductive polycrystalline diamond film, in-plane temperature distribution abruptly deteriorates if the film thickness becomes less than 0.1 µm, as shown in FIG. 2.

If the film thickness is in excess of 500 µm, on the other hand, the heat capacity of the tool tip 100 increases and hence the quantity of power required for temperature rise increases and temperature rise and cooling characteristics get inferior. Further, the cost for forming the conductive polycrystalline diamond film increases while warping of the material increases due to stress of the conductive polycrystalline diamond film.

Figure 3:
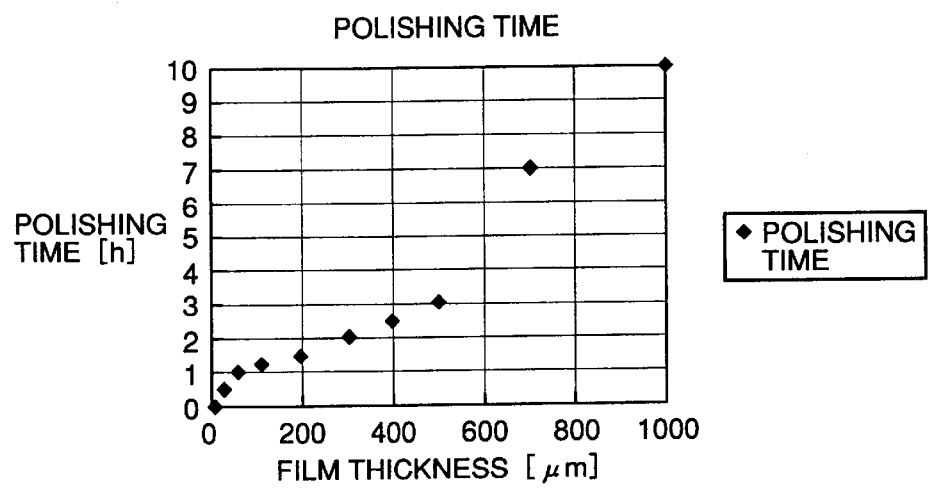
FIG. 3 is a diagram showing the relation between the film thickness of the conductive polycrystalline film and a polishing time.

Therefore, a polishing time for attaining flatness abruptly lengthens if the film thickness is in excess of 500 µm as shown in FIG. 3, and the working cost increases. Therefore, it can be said that the film thickness of the conductive polycrystalline diamond film is preferably at least 0.1 µm and not more than 500 µm.

As to the value of the specific resistance, contact resistance with a metal electrode is high to readily spark in energization if the specific resistance of the conductive polycrystalline diamond film is high. In order to avoid this, specific resistance of not more than $1\times10^3$ Ωcm is necessary. If an impurity content becomes such a level that the specific resistance is not more than $1\times10^{-4}$ Ωcm, it causes deterioration of the film quality of the conductive polycrystalline diamond film and damages characteristics such as heat conductivity, abrasion resistance and the like.

In order to quickly increase the temperature of the conductive polycrystalline diamond film to a prescribed level, on the other hand, it is necessary to apply power of about 500 W to 1 KW to the tool tip with a power source of 100 V–20 A capacity. Therefore, it is preferable that the area of the tool pressing surface is generally several 100 mm$^2$, and that the specific resistance is in the range of at least $1\times10^{-4}$ Ωcm and not more than $1\times10^3$ Ωcm, in consideration of the film thickness of the aforementioned conductive polycrystalline diamond film.

In case of structuring the conductive polycrystalline diamond film from at least two types of films whose contents of boron differ from each other, for example, forming a conductive polycrystalline diamond film whose content of boron is high on the aforementioned substrate side and forming a conductive polycrystalline diamond film whose content of boron is low on this film, it is necessary for the upper layer conductive polycrystalline diamond film whose content of boron is low that the change of a resistance value is less than 0.01 Ω with film thickness change of several μm resulting from polishing. Consequently, it is preferable that the specific resistance of the conductive polycrystalline diamond is at least $1\times10^1$ Ωm and not more than $1\times10^3$ Ωcm. Therefore, it can be said to be preferable that the specific resistance required of the conductive polycrystalline diamond film is at least $1\times10^{-4}$ Ωcm and less than $1\times10^3$ Ωcm.

By thus employing the conductive polycrystalline diamond film having the aforementioned film thickness and specific resistance, it is achieved that this conductive polycrystalline diamond film itself resistively generates heat. Further, this conductive polycrystalline diamond film is excellent in heat conductivity, and homogeneous temperature distribution is obtained on the surface employed for pressure bonding. Further, it causes heat generation of only a part of the conductive polycrystalline diamond film coming into contact with a semiconductor chip, whereby the heat capacity reduces and heat response becomes quicker.

Here, it is known that a conductive polycrystalline diamond film to which boron is added as an impurity changes to a low resistance state under a high temperature since the same is a p-type semiconductor, and the specific resistance and temperature dependency of the specific resistance vary with the temperature of boron (H. Shiomi, Japanese Journal of Applied Physics, Vol. 30, No. 7 (1991)).

The smaller the content of boron is, the higher the specific resistance of a diamond polycrystal is and the larger a change rate with respect to the temperature is. If the density of an additive is less than $10^{18}$ atm·m$^{-3}$, the value of the specific resistance reduces by $10^{-3}$ [Q.cm] (Diamond and related materials 4 (1995)).

On the other hand, the impurity level degenerates and becomes a metallic band structure (causes Mott dislocation) if the atom concentration of the added boron exceeds 2000 ppm, whereby it has metallic conductivity. Namely, it changes to a high resistance state depending on increase of the temperature, whereby temperature control as a heater becomes easy.

If boron of at least 50000 ppm is added, deterioration of the film quality is remarkable and the characteristics of diamond such as high hardness and high heat conductivity are lost. Therefore, the boron concentration of the conductive polycrystalline diamond film is desirably at least 100 ppm and less than 50000 ppm.

If the introduction quantity of the fault of the sp2 structure increases, the specific resistance decreases depending on this in the conductive polycrystalline diamond film. It is difficult to quantitatively know the fault density of the sp2 structure introduced into the conductive polycrystalline diamond film. However, it is possible to qualitatively obtain the fault density of the sp2 structure from the ratio of peak intensity of a spectrum of 1333 cm$^{-1}$ resulting from an sp3 structure of diamond and peak intensity of a broad spectrum in the vicinity of 1540 cm$^{-1}$ resulting from the sp2 structure. Since the fault concentration is small if this ratio of peak intensity is less than 0.5, a preferable specific resistance is not obtained although the film quality of the conductive polycrystalline diamond film is excellent. On the other hand, the film quality of the conductive polycrystalline diamond film deteriorates and the desired performance is not obtained if the ratio of the peak intensity exceeds 10.

As a conductor film of the outermost surface, any of at least one metal material, which has a high melting point and is strong in oxidation resistance under a high temperature, selected from a group consisting of Au, Pt, Ag, Ni, Ta and Cr, or an AgPd alloy or a Pt—Ir alloy which is excellent in deposition resistance, damage characteristics and insulation recoverability, or an oxide containing Ag and at least one or more elements selected from a group consisting of Gd, In, Sn, Zn and Cu, or a metal carbide containing Ag and W is preferable.

Referring again to FIG. 1A to FIG. 1C, a suction through hole 5 employed for carrying a semiconductor chip is further provided in this tool tip 100. Further, electrode metals 4 for feeding electricity to the conductive polycrystalline diamond film 1 are provided on the conductive polycrystalline diamond film 1 provided on the side surfaces of the substrate 2.

In the tool tip 100 thus formed, it is achieved that the conductive polycrystalline diamond film 1 resistively generates heat by feeding electricity from the surfaces formed with the electrode metals 4. Further, it is possible to make cooling from an outer peripheral portion of the tool tip 100 relaxed by providing these electrode metals 4 only on outer peripheral portions of an effective area of the tool tip 100 employed for pressure bonding and causing the heat generation along the outer peripheral portions.

Figure 4A:
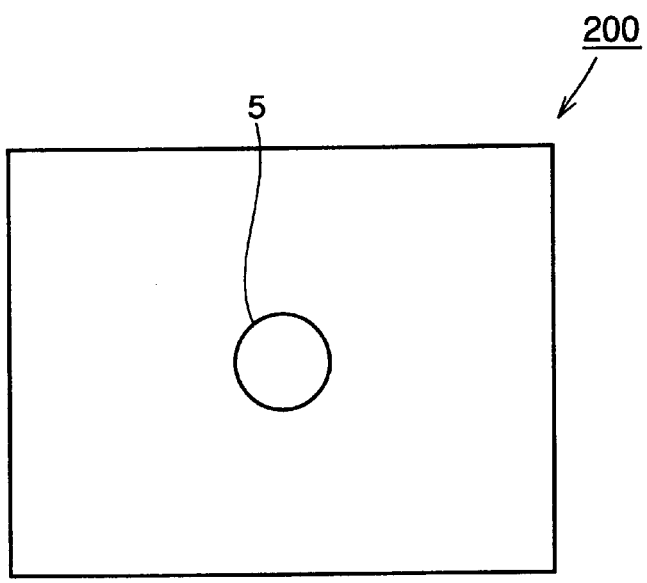
FIG. 4A to FIG. 4C are diagrams showing another structure of the tool tip in the present invention.
Figure 4B:
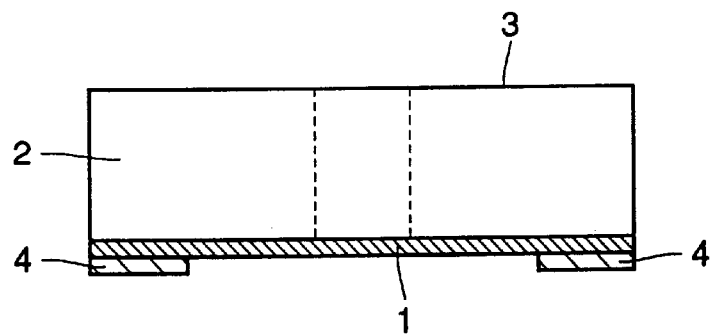
Figure 4C:
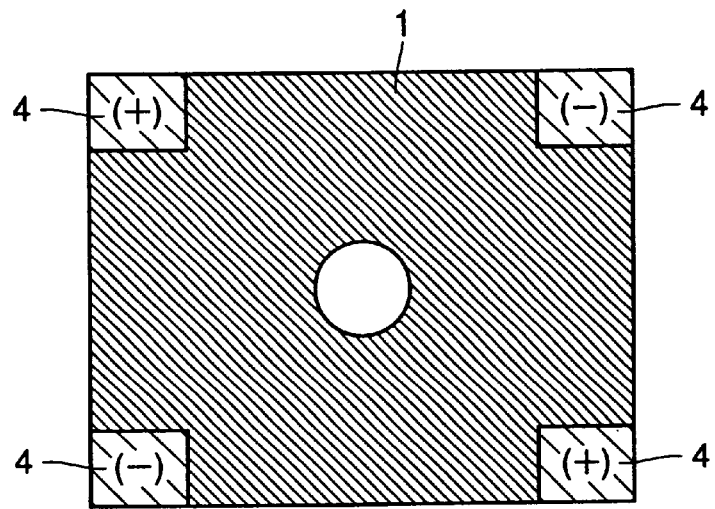

In this case, it becomes possible to supply power only to outer peripheral portions without providing a complicated circuit pattern by providing electrode metals 4 of at least four portions and supplying potential difference between adjacent electrodes as in a tool tip 200 shown in FIG. 4A to FIG. 4C.

The electrode metals 4 are not restricted to the surfaces shown in FIG. 1A to FIG. 1C and FIG. 2 but may be partially formed on a surface opposite to the forward end surface 3 depending on external packaging equipment. Therefore, it may simply be a structure capable of feeding electricity to the conductive polycrystalline diamond film 1 and heat-generating or heating the surface employed for pressure bonding.

On the other hand, the substrate 2 is mainly composed of at least one material selected from a diamond polycrystal synthesized by a vapor-phase synthetic method, which strongly adheres to the conductive polycrystalline diamond film 1, Si, SiC, AlN, $Si_3N_4$ and diamond. The dimensions of the substrate 2 are individually decided from the size of the required tool tip.

Figure 5A:
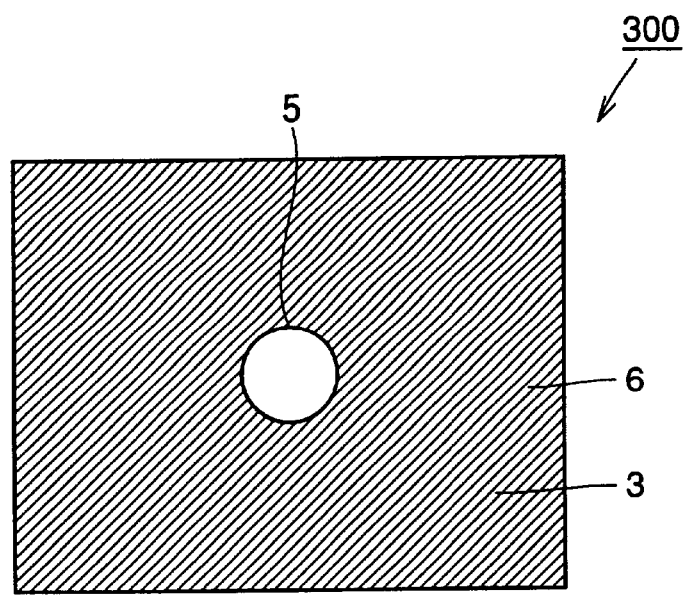
FIG. 5A to FIG. 5C are diagrams showing still another structure of the tool tip in the present invention.
Figure 5B:
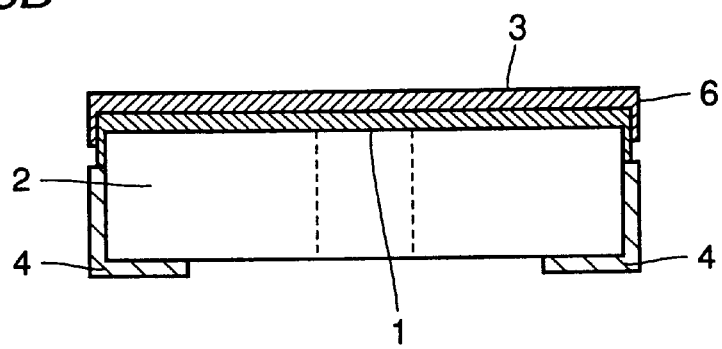
Figure 5C:
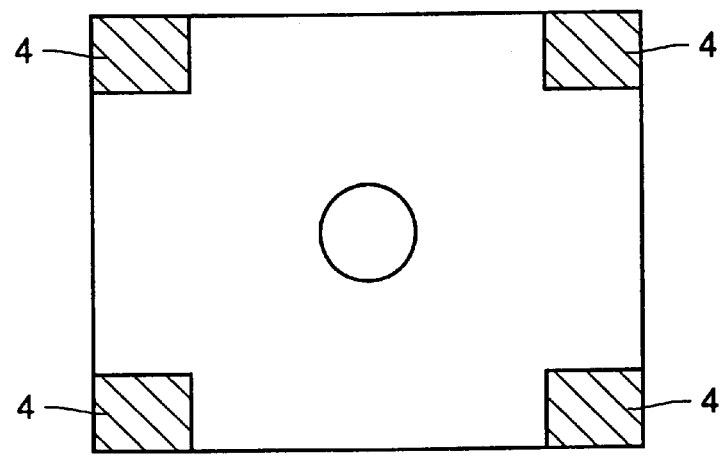

In case of such a structure that the conductive polycrystalline diamond film 1 directly comes into contact with the semiconductor chip, it may happen that an energization current for heat generation leaks to the semiconductor chip side and consequently damages the circuit. In this case, it is possible to prevent a leakage current by covering an outer layer part of a conductive polycrystalline diamond film 1 with an insulating diamond film 6 having specific resistance of at least $10^5$ cm as in the structure of a tool tip 300 shown in FIG. 5A to FIG. 5C.

Figure 6A:
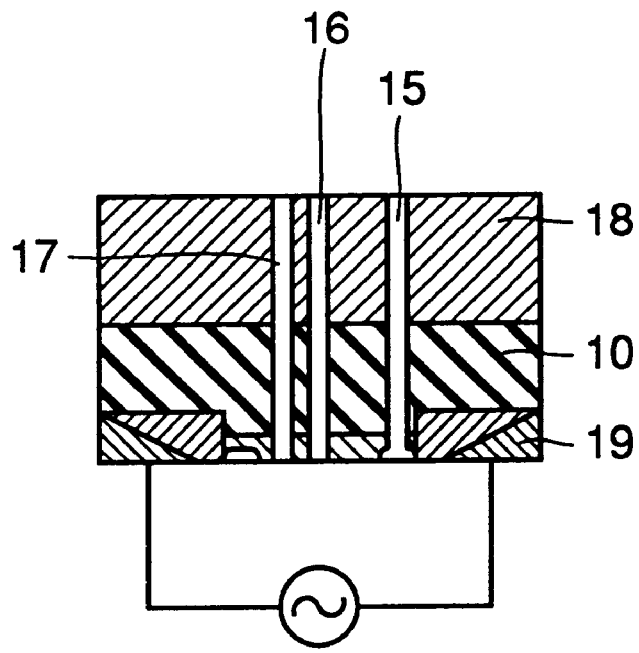
FIG. 6A and FIG. 6B are diagrams showing the structure of a feed holder in the present invention.
Figure 6B:
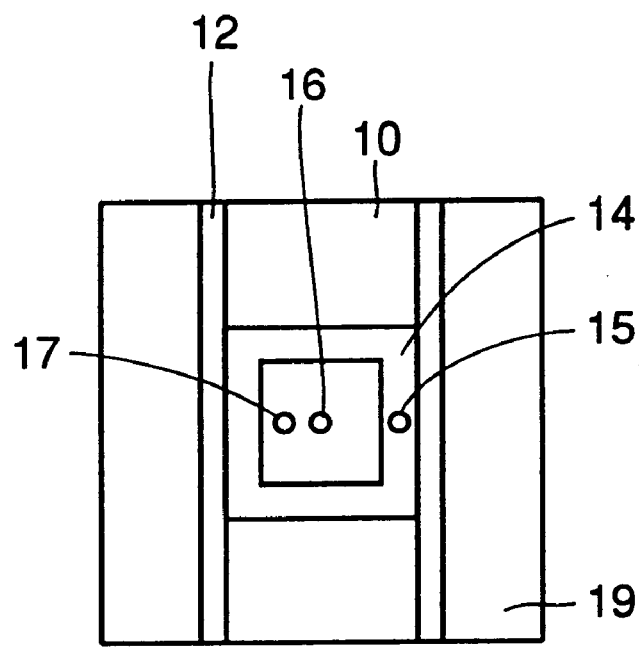

The structure of a feed holder for feeding power to the tool tip is now described with reference to FIG. 6A and FIG. 6B. Insulating ceramics 10 having high strength forming a base, conductor films 12 for supplying power to the tool tip, a tool tip suction groove 14 and a tool tip suction vacuum tube 15 for sucking the tool tip, and a semiconductor chip suction vacuum tube 16 for the tool tip for sucking a semiconductor chip are provided, and a temperature sensor 17 for measuring the temperature of the tool tip is further incorporated. The temperature of the tool tip measured by this temperature sensor 17 is fed back to a temperature control mechanism.

Further, low heat conduction insulating ceramics 18 whose heat conductivity is low are employed in a contact part with an external device, for heat insulation from the external device. In addition, metal electrodes 19 on which metal films whose high temperature oxidation resistance is strong are mounted for feeding to the conductor films 12.

As to the low heat conduction insulating ceramics 18, it is desirable to use such ceramics having high strength and a small heat conductivity not more than 50 W/mk for reducing heat capacity of a heater part, since it is necessary to apply a load in packaging of the semiconductor chip.

In case of employing an insulating diamond polycrystal for the substrate 2 of the tool tip here, it also becomes possible to utilize the surface of the substrate 2 opposite to the surface covered with the conductive polycrystalline diamond film 1 as the surface for pressure-bonding the semiconductor chip.

In temperature measurement of a tool tip of a conventional structure in case of mounting a thermocouple, there has been such a problem that the thermocouple peels off. In a tool tip whose temperature response is quick, further, the temperature response deteriorates due to addition of the heat capacity of the thermocouple itself, and it has been impossible to apply temperature control that shortens a packaging time by making the best use of its performance. Therefore, it is necessary to employ a thermometer which is quick in temperature response and capable of making non-contact measurement. Therefore, a radiation thermometer of an optical fiber system is desirable to be incorporated into an external packaging device which is limited in volume.

Further, electric specific resistance of a conductive polycrystalline diamond film changes depending on the temperature and exhibits a thermistor characteristic, as described above. Therefore, it also becomes possible to measure the resistance value on the basis of a voltage applied to the conductive polycrystalline diamond film and a current value, to obtain the temperature of the tool tip and to control the temperature of the tool tip through this thermistor characteristic. In this case, incorporation of a temperature measuring mechanism into the feed holder becomes unnecessary.

More Concrete Examples of the tool tip and the feed holder in the aforementioned embodiments are now described below.

CONCRETE EXAMPLE 1

First, the structure of a tool tip 400 in this Concrete Example 1 is described with reference to FIG. 7A to FIG. 7C. A conductive polycrystalline diamond film 1 of about 10 μm in film thickness and $8 \times 10^{-3}$ Ωcm in specific resistance to which boron is added as an impurity is deposited by a vapor-phase synthetic method on a surface of 20 mm×20 mm of an SiC substrate 2 of 20 mm×20 mm×5 mm having one suction through hole 5 of about 1 mm in diameter on its central portion. Thereafter an insulating diamond film 6 is further deposited by 50 μm on the conductive polycrystalline diamond film 1.

Both of the conductive polycrystalline diamond film 1 and the insulating diamond film 6 are formed by microwave plasma CVD with methane and hydrogen as gas.

The gas flow rates in this film formation are 5 sccm for methane and 500 sccm for hydrogen, and diborane of B/C=20000 ppm with respect to methane was added to the material gas during film formation of the conductive polycrystalline diamond film 1.

When a conductive polycrystalline diamond film synthesized by the same conditions was analyzed by SIMS, it was found that boron was contained therein by 2000 ppm.

Thereafter as electrodes on side surface parts of the SiC substrate 2, Ti was coated by 1 μm, Pt was coated thereon by 1 μm, and Au was further coated on this Pt by 3 μm.

Then, the conductive polycrystalline diamond film 1 becoming a pressing surface on the forward end of the tool tip was finished by lapping to be 0.1 μm in surface roughness Rmax and 0.01 mm in parallelism with an opposite surface, for preparing the tool tip 400 in this Concrete Example.

Figure 8A:
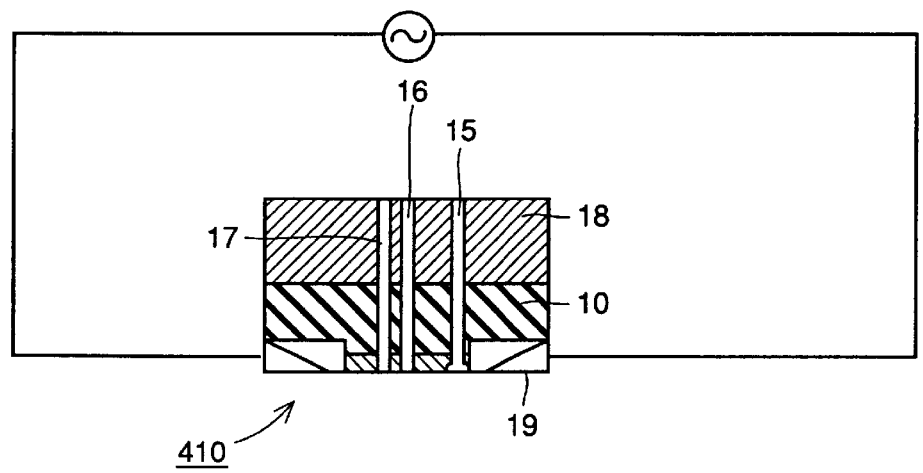
FIG. 8A and FIG. 8B are diagrams showing the structure of a feed holder for feeding electricity to the tool tip in Concrete Example 1.
Figure 8B:
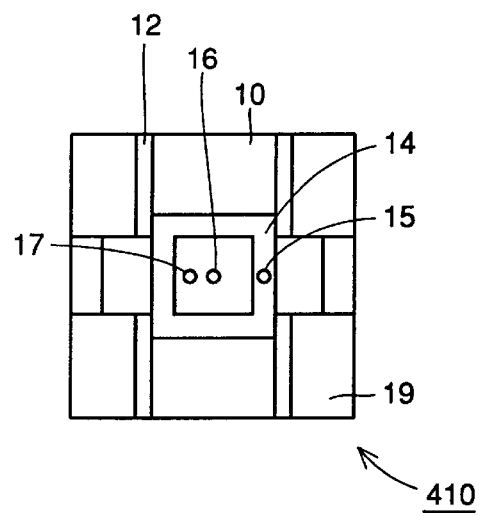
Figure 9A:
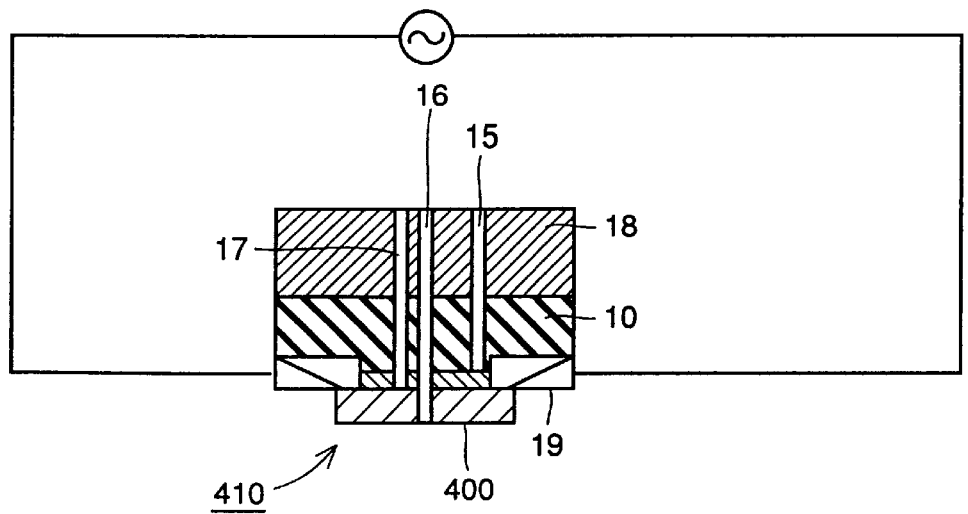
FIG. 9A and FIG. 9B are diagrams showing a structure in case of mounting the tool tip in Concrete Example 1 on the feed holder.
Figure 9B:
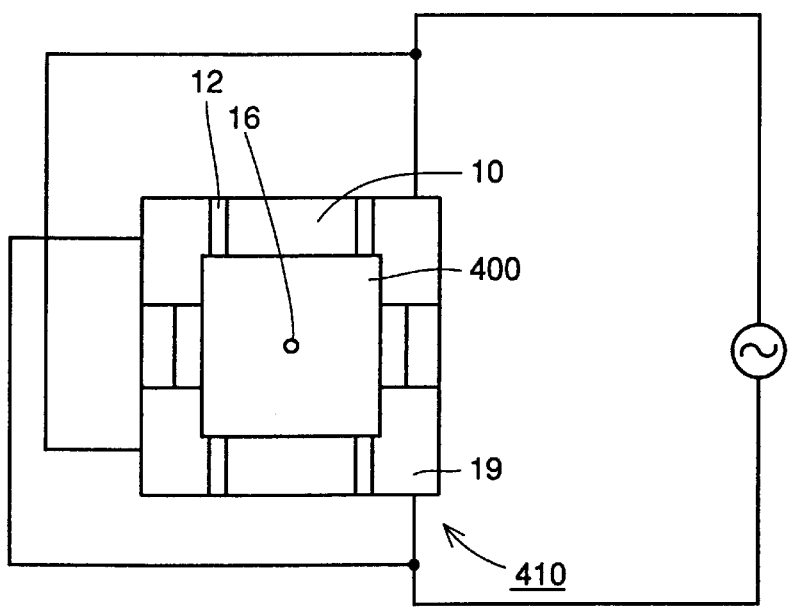

Then, with reference to FIG. 8A, FIG. 8B, FIG. 9A and FIG. 9B, a feed holder 410 consisting of the structure shown in FIG. 8A and FIG. 8B is mounted on external packaging equipment, such that this feed holder 410 can carry the tool tip 400 by vacuum suction. Thereafter a temperature rise time from 20° C. to 500° C., a cooling time in air cooling from 500° C. to 80° C., temperature distribution of the forward end surface, flatness of the forward end surface, and a state of the tool tip 400 after a repetitive heating test of 100,000 times were observed with respect to this tool tip 400.

As a comparative example, a conventional tool tip in which a vapor-phase synthesized diamond film 51 of 1.0 mm in film thickness was brazed to a heat generating part of an Mo shank 50 was prepared as shown in FIG. 10, and similar evaluation was made. FIG. 11 shows the results.

As shown in FIG. 11, it is understood that the tool tip in this Concrete Example is superior in all valuation points except that both the tool tip in this Concrete Example and the tool tip of the conventional form had equivalent results in the temperature distribution of 500° C. and the repetitive heating test of 100,000 times.

While the conventional tool tip required 45 minutes for mounting on the bonding equipment, it becomes possible to mount the tool tip according to the inventive Concrete Example in this context in about one minute since the parallelism of a mounting surface that is mounted on or contacts the equipment and the surface employed for pressure bonding is maintained.

Figure 7A:
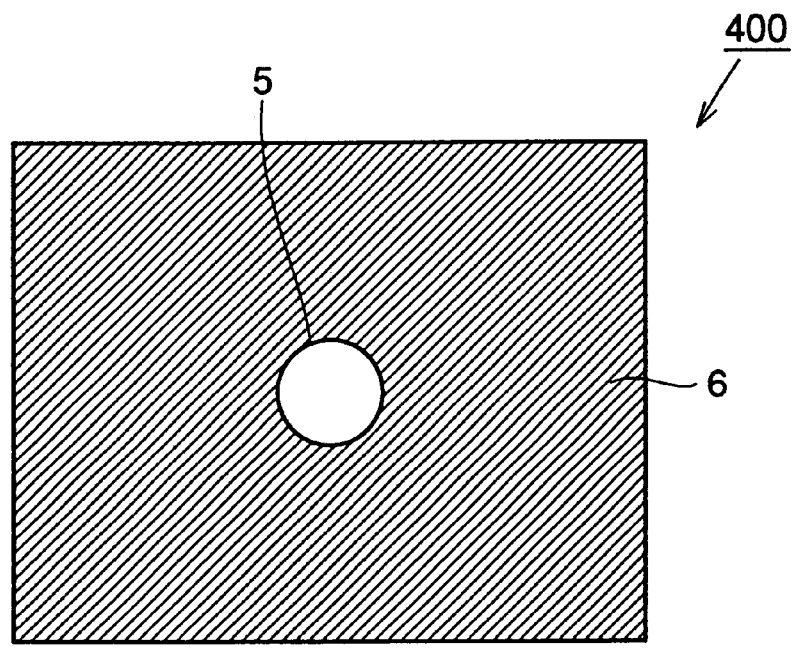
FIG. 7A to FIG. 7C are diagrams showing the structure of a tool tip in Concrete Example 1.
Figure 7B:
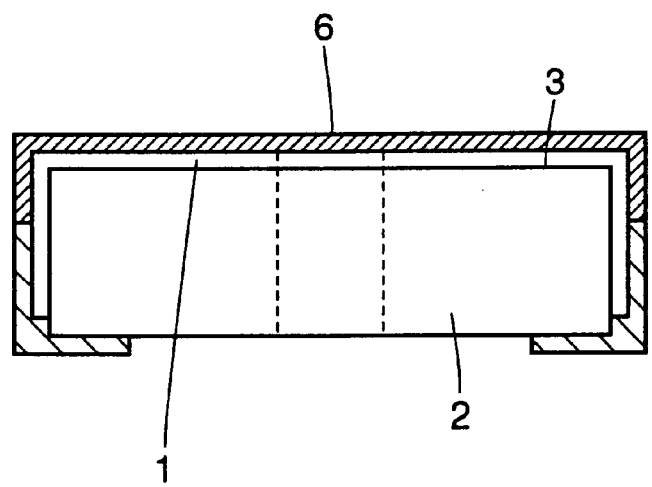
Figure 7C:
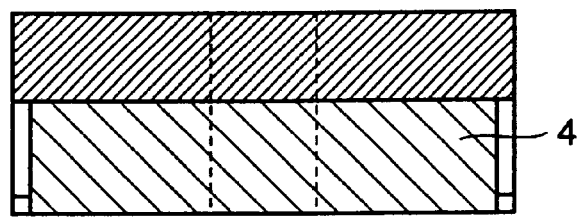

Further, tool tips of the same shape shown in FIG. 7A to FIG. 7C were prepared in 11 types while changing the specific resistance values, film thicknesses and boron contents of conductive polycrystalline diamond films and then these tool tips were evaluated. FIG. 12 shows the results. Boron contents were obtained by analyzing samples prepared under the same conditions by SIMS. Results of temperature rise from 20° C. to 500° C., cooling from 500° C. to 80° C., in-plane temperature distribution at 500° C., and surface state observation by ×50 microscope observation after an endurance test after 1,000,000 cycles of heating are shown. As understood from FIG. 12, there was no sample capable of attaining sufficient performance in all characteristics in the tool tips other than Nos. 5, 6 and 7. Also from these data, therefore, it is understood preferable that the specific resistance of the conductive polycrystalline diamond film employed for the tool tip is at least $1 \times 10^4$ Ωcm and less than $1 \times 10^3$ Ωcm and the film thickness is at least 0.1 μm and not more than 500 μm.

CONCRETE EXAMPLE 2

Concrete Example 2 is now described.

Figure 13A:
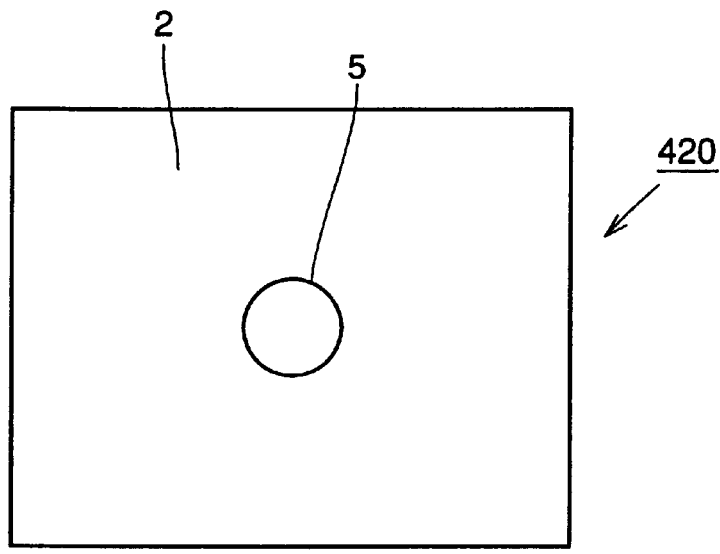
FIG. 13A to FIG. 13C are diagrams showing the structure of a tool tip in Concrete Example 2.
Figure 13B:
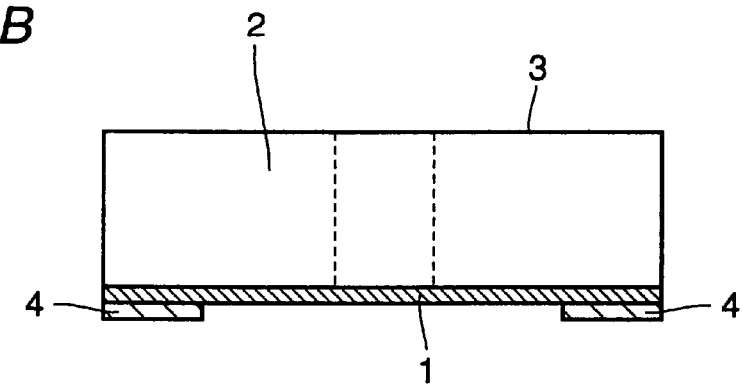
Figure 13C:
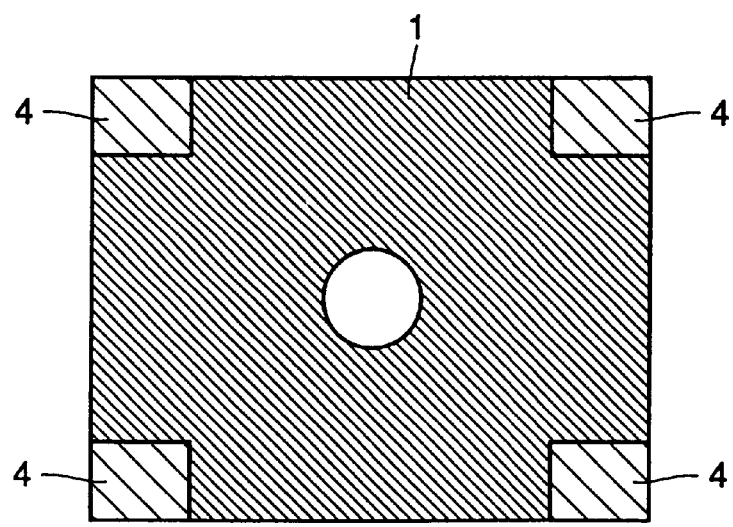

Referring to FIG. 13A to FIG. 13C, a conductive polycrystalline diamond film 1 of 8 μm in film thickness and $8 \times 10^{-3}$ Ωcm in specific resistance to which boron was added as an impurity was deposited by a vapor-phase synthetic method on a substrate 2 consisting of insulating polycrystalline diamond of 12 mm×12 mm×0.3 mm in a tool tip 420 in this Concrete Example 2.

As to growth of a boron-added layer, film formation was performed by thermal filament CVD with methane, hydrogen and trimethyl boron of 5000 ppm with respect to methane as material gas.

When a conductive polycrystalline diamond film synthesized by the same conditions was analyzed by SIMS, it was found that boron was contained therein by 800 appm.

After formation of the conductive polycrystalline diamond film 1, a suction through hole 5 of about 1 mm in diameter was formed on a central portion of the substrate 2 by excimer laser beam machining.

After forming the suction through hole 5, Ti was coated by 1 μm on the conductive polycrystalline diamond film 1 as an electrode 4, Mo was coated thereon by 2 μm, Au was coated further thereon by 3 μm, and finally Ni was coated by 1 μm. An opposite surface of the surface of the substrate 2 covered with the conductive polycrystalline diamond film 1 was finished into 0.1 μm in Rmax, for preparing the tool tip 420 in this Concrete Example.

Figure 14A:
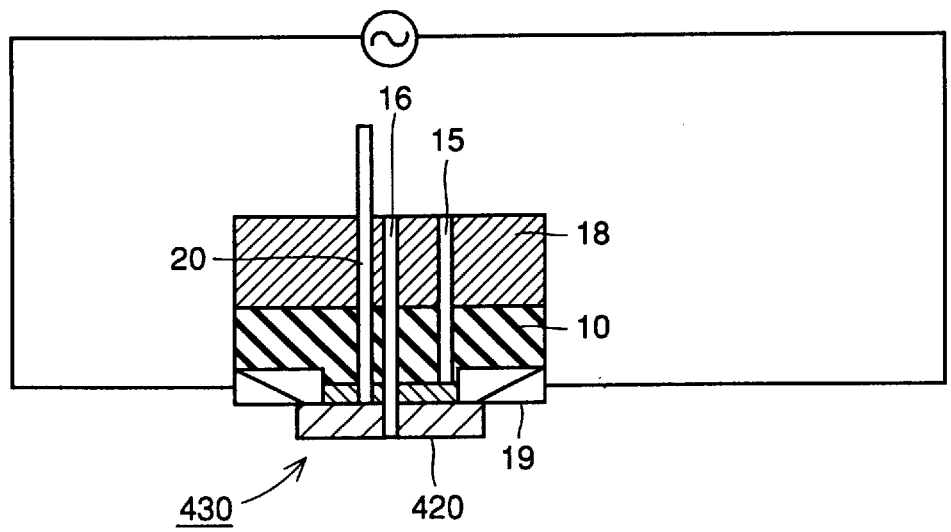
FIG. 14A and FIG. 14B are diagrams showing the structure of a feed holder for feeding electricity to the tool tip in Concrete Example 2.
Figure 14B:
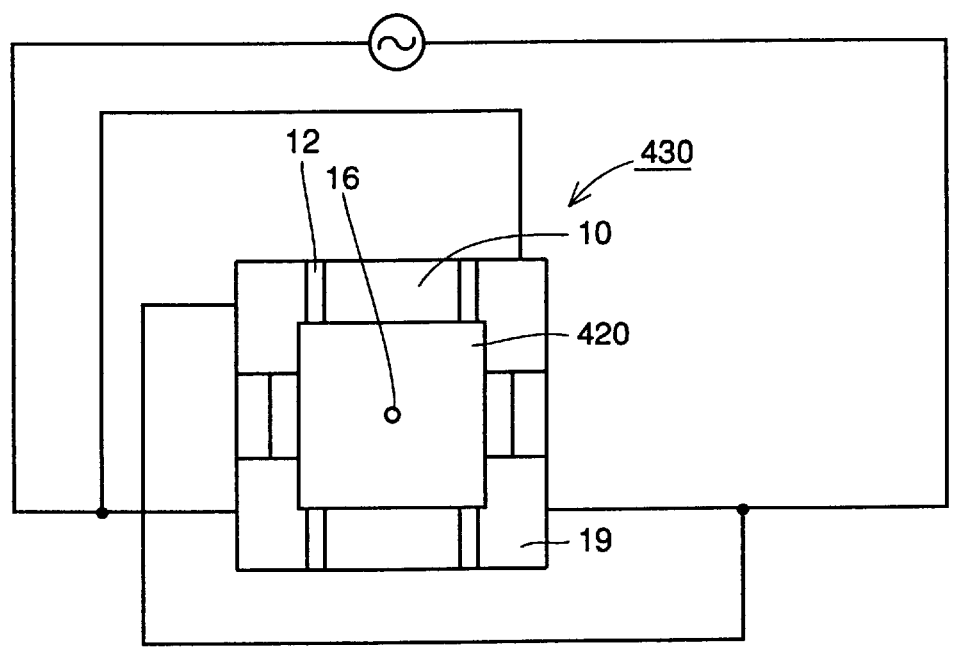

As shown in FIG. 14A and FIG. 14B, a feed holder 430 is mounted on equipment for external packaging, for making this feed holder 430 mount, i.e. receive and hold, the tool tip 420 by vacuum suction. Thereafter a temperature rise time from 20° C. to 600° C., a cooling time in air cooling from 600° C. to 80° C., temperature distribution of the forward end surface, flatness of the forward end surface and a state of the tool tip after repetitive heating of 100,000 times were observed. As a comparative example, evaluation was made by employing the tool tip of the conventional form shown in FIG. 10. While a method of mounting a thermocouple to a metal shank part by spot welding was employed for temperature control of the conventional tool tip, the inventive temperature control was achieved through change of the resistance value of conductive diamond resulting from the temperature in the tool tip in this Concrete Example. FIG. 15 shows the results. FIG. 16 shows a resistance curve of the temperature of the tool tip in this Concrete Example.

As understood from FIG. 15 and FIG. 16, it was recognized that the tool tip of this Concrete Example was superior in all points except that the results of the tool tip of this Concrete Example were the same as the results of the tool tip of the conventional form with regard to the temperature distribution of 600° C.

CONCRETE EXAMPLE 3

Concrete Example 3 is now described.

Figure 17A:
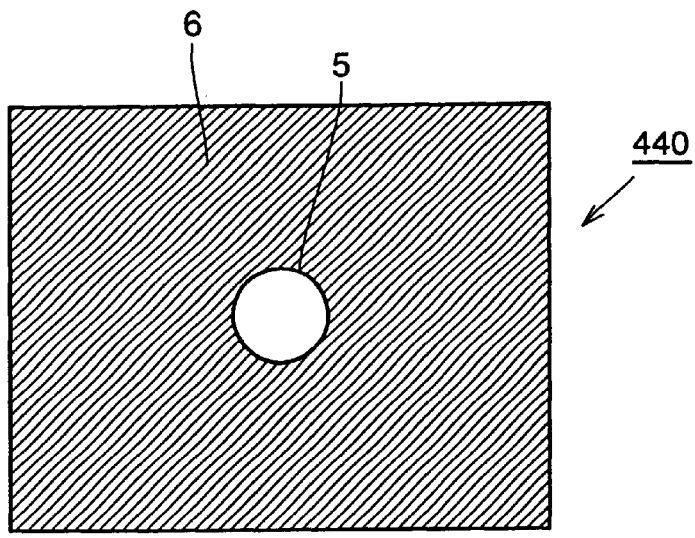
FIG. 17A to FIG. 17C are diagrams showing the structure of a tool tip in Concrete Example 3.
Figure 17B:
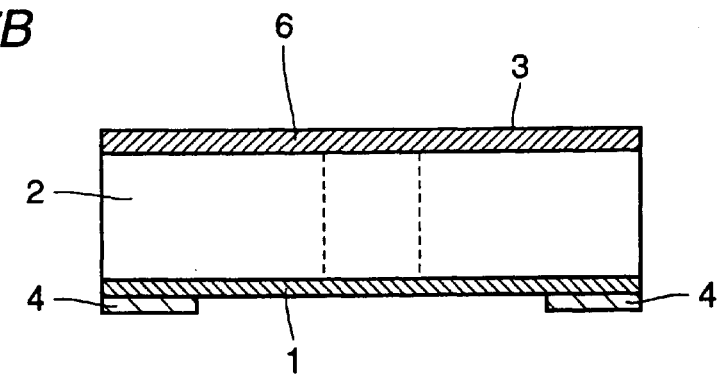
Figure 17C:
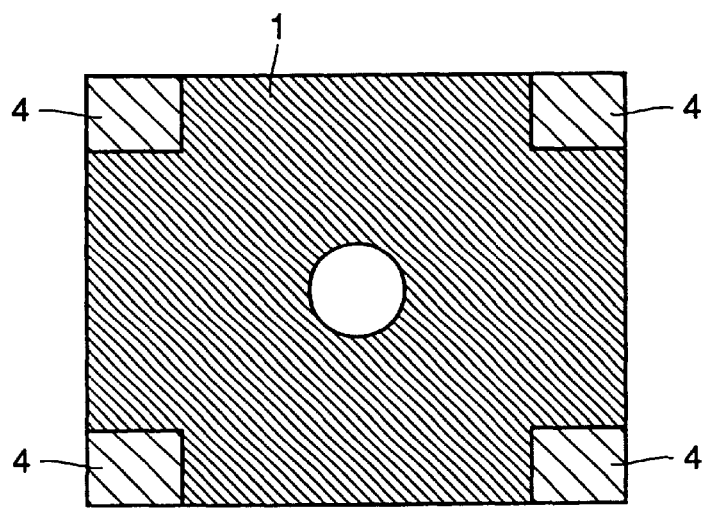

With reference to FIG. 17A to FIG. 17C, the structure of a tool tip 440 in this Concrete Example is described. A conductive polycrystalline diamond film 1 of about 10 μm in film thickness and $1 \times 10_3$ Ωcm in specific resistance containing a crystal fault synthesized and obtained with high methane concentration is deposited on a surface of 20×20 mm of an SiC substrate 2 of 20 mm×20 mm×3 mm having one suction through hole 5 of about 1 mm in diameter on its central portion.

Thereafter an insulating diamond film 6 is deposited on a surface opposite to the conductive polycrystalline diamond film 1 by about 50 μm. Both of the conductive polycrystalline diamond film 1 and the insulating diamond film 6 were synthesized by microwave plasma CVD with methane and hydrogen as material gas. The methane flow rate during film formation of the conductive polycrystalline diamond film 1 was 50 sccm, and that of hydrogen was 500 sccm.

In this conductive polycrystalline diamond film 1, a peak in the vicinity of 1500 cm$^{-1}$ exhibiting an sp2 structure was observed to about the same extent as a peak of 1333 cm$^-$exhibiting an sp3 structure of diamond by Raman spectroscopic analysis.

As electrodes 4 on the conductive polycrystalline diamond film 1, Ti of 1 μm, Pt of 1 μm and Au of 3 μm were coated in superposition, and Ta was coated further thereon by 0.5 μm. The insulating diamond film 6 becoming a pressing surface on the forward end of the tool tip was finished into 0.1 μm in surface roughness Rmax and 0.01 mm in parallelism with the opposite surface by lapping, for preparing the tool tip 440 based on this Concrete Example.

The tool tip 440 consisting of this structure was mounted on the feed holder 430 shown in FIG. 14A and FIG. 14B by vacuum suction, and this feed holder 430 was mounted on equipment for external packaging, for making the same evaluation as Concrete Example 1. FIG. 18 shows the results.

It exhibited performance substantially identical to that employing a conductive polycrystalline diamond film to which boron was added as an impurity, and it was recognized that the tool tip in this Concrete Example also attains an effect equivalent to that of the tool tip of Concrete Example 1.

CONCRETE EXAMPLE 4

A tool tip of the same shape as Concrete Example 3 shown in FIG. 17A to FIG. 17C was prepared. However, a conductive polycrystalline diamond film was formed by thermal filament CVD with methane, hydrogen and trimethyl boron of B/C=10000 ppm with respect to methane as material gas. It is about 10 μm in film thickness, and $3 \times 10^3$ Ωcm in specific resistance.

Figure 19:
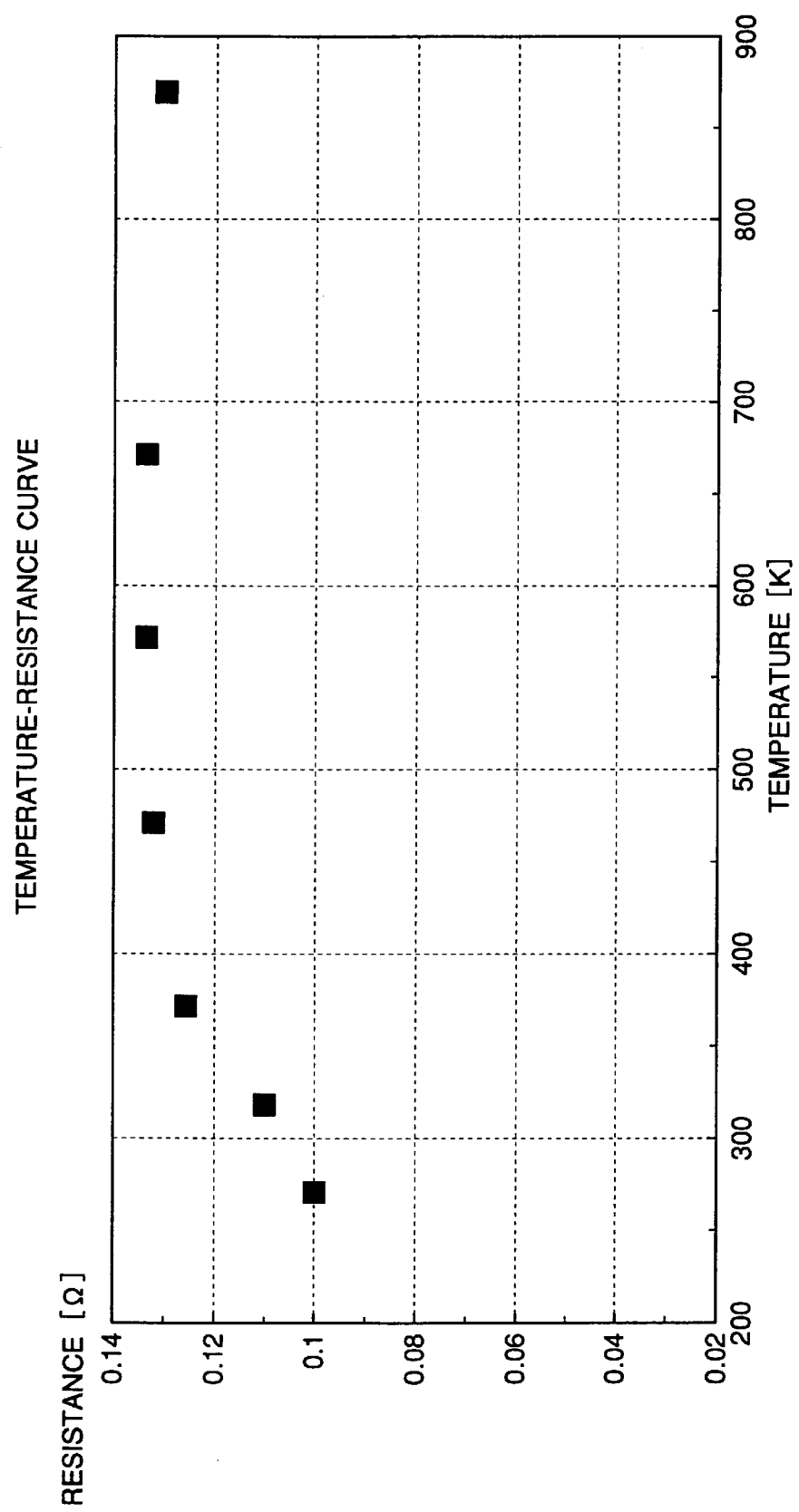
FIG. 19 is a diagram showing a resistance curve of the temperature of the tool tip in Concrete Example 3.

Boron was contained by 10000 ppm when this conductive polycrystalline diamond film was analyzed by SIMS. The higher the temperature rises, the higher resistance it attains, and the resistance value becomes constant when the temperature is in excess of 600 K, as shown in FIG. 19.

Ti was coated by 1 μm in electrode parts, and Pt was coated thereon by 2 μm.

Figure 20A:
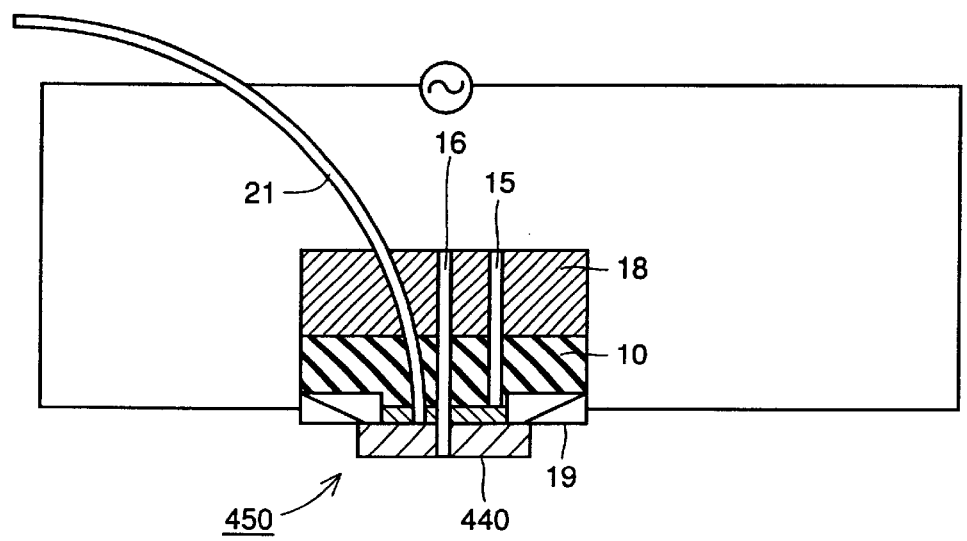
FIG. 20A and FIG. 20B are diagrams showing the structure of a feed holder for feeding electricity to a tool tip in Concrete Example 4.
Figure 20B:
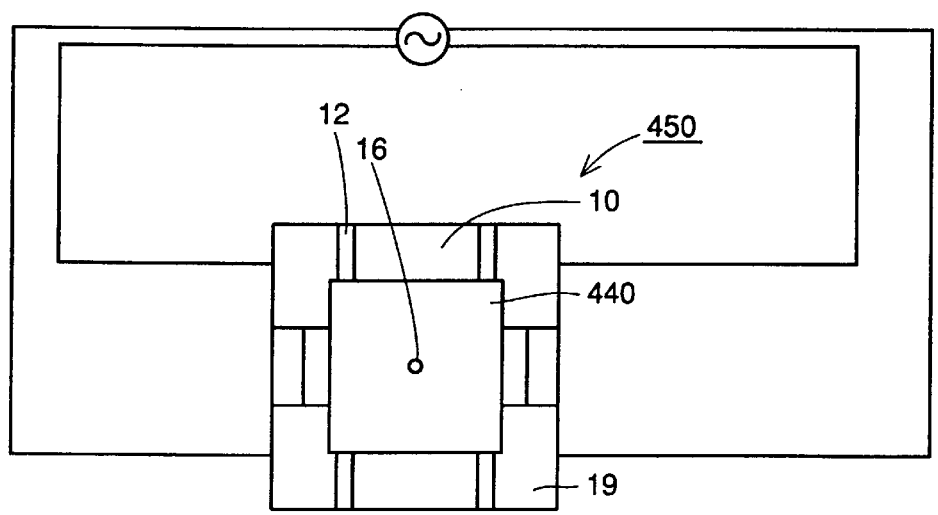

The tool tip consisting of this structure was mounted on a feed holder 450 shown in FIG. 20A and FIG. 20B by vacuum suction, and this feed holder 450 was mounted on equipment for packaging. Thereafter the same evaluation as Concrete Example 3 was made. FIG. 21 shows the results.

While the same potential is applied to the electrodes positioned on the opposite angles of the tool tip in the feed holder 430 shown in FIG. 14A and FIG. 14B, different potentials can be supplied to the respective ones of four electrodes in the feed holder shown in FIG. 20A and FIG. 20B. Power was adjusted and temperature control was performed by adjusting the potentials for supplying proper resistance values between the respective electrodes in total. Therefore, it becomes possible to further homogenize the in-plane temperature distribution of the tool tip by suppressing overshoot in temperature rise to not more than 5° C. In this feed holder 450, the tool tip temperature was measured with an optical fiber radiation thermometer 21, for controlling the tool tip temperature. Therefore, an extremely excellent temperature rise characteristic was obtained by making the best use of the high temperature response of the tool tip. As shown in FIG. 21, the temperature distribution is superior to that of the tool tip of Concrete Example 1, and it has equivalent performance as to the remaining items.

CONCRETE EXAMPLE 5

Concrete Example 5 is now described.

Figure 22A:
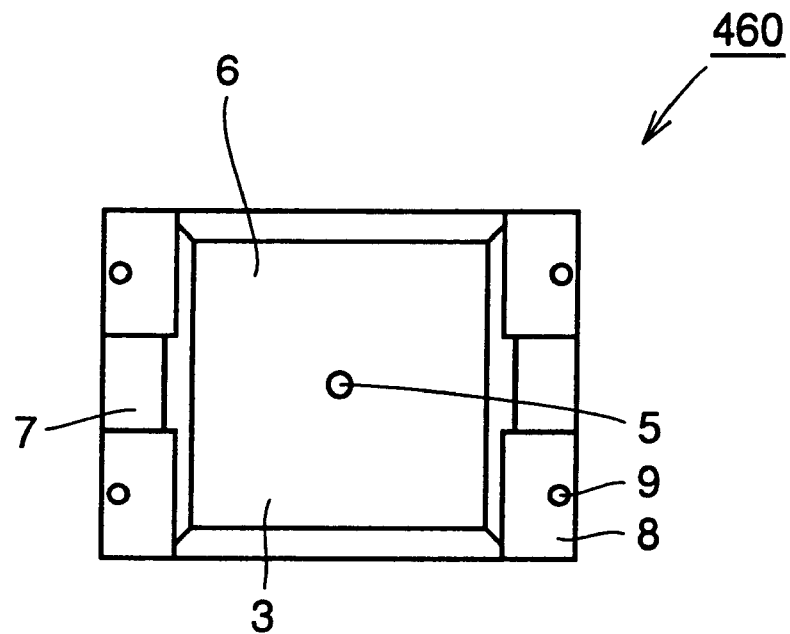
FIG. 22A and FIG. 22B are diagrams showing the structure of a tool tip in Concrete Example 5.
Figure 22B:
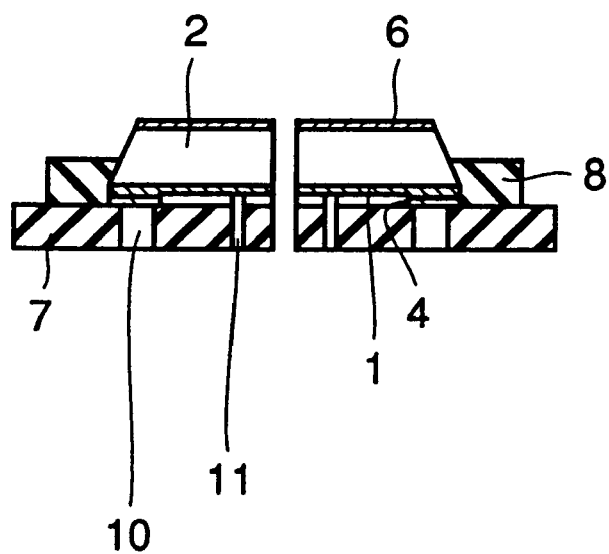
Figure 23A:
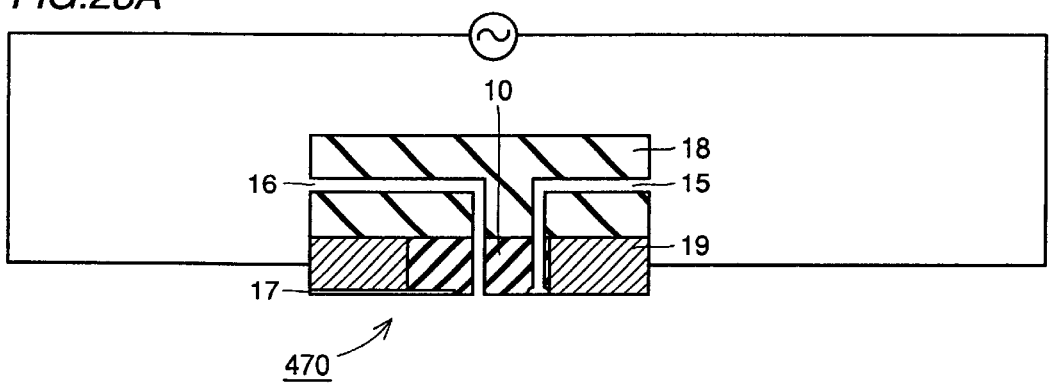
FIG. 23A and FIG. 23B are diagrams showing the structure of a feed holder for feeding electricity to the tool tip in Concrete Example 5.
Figure 23B:
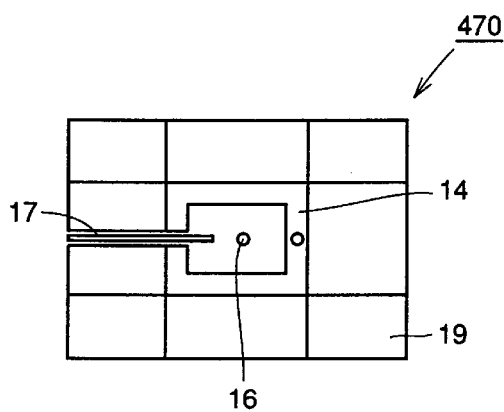
Figure 24A:
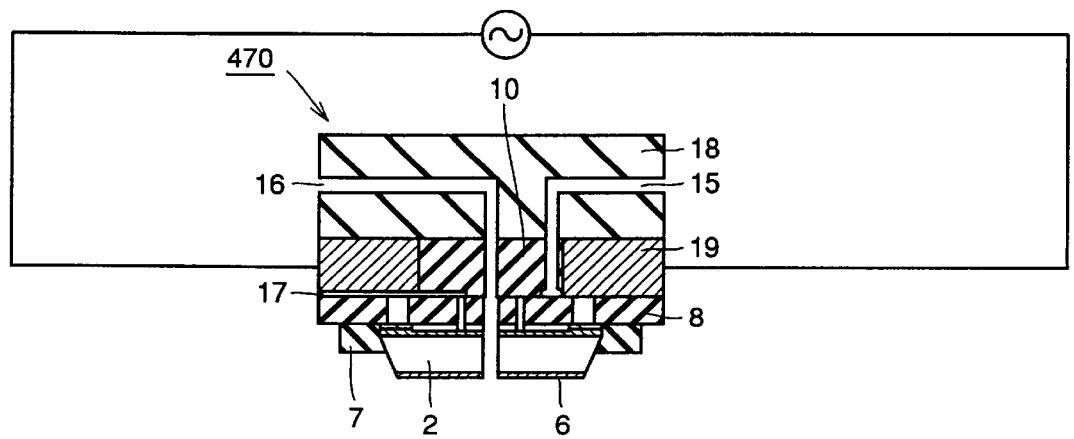
FIG. 24A and FIG. 24B are diagrams showing a structure mounting the tool tip in Concrete Example 5 on the feed holder.
Figure 24B:
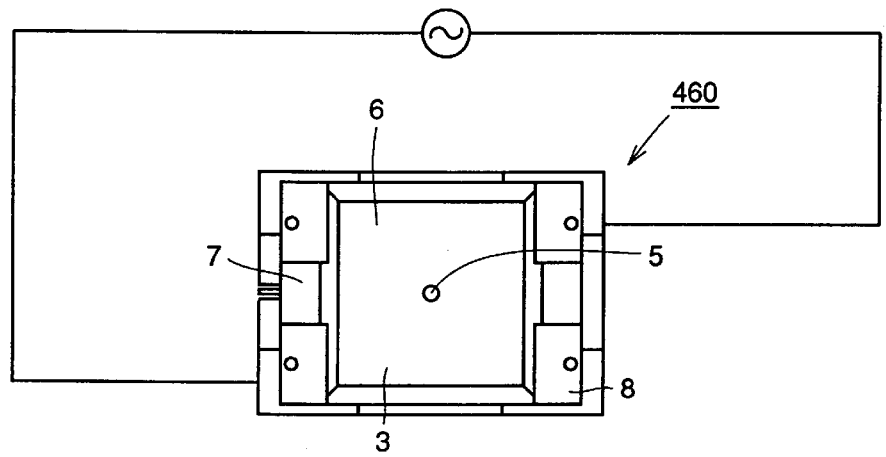

Referring to FIG. 22A and 22B, an insulating polycrystalline diamond film 6 of about 50 μm in film thickness was deposited on an upper surface of an Si substrate 2 of 10 mm×10 mm×3 mm and two layers of conductive polycrystalline diamond films 1 to which boron was added as an impurity were deposited on its opposite surface in a tool tip 460 in this Concrete Example. The first layer was rendered 5 μm in film thickness and $4 \times 10^{-3}$ Ωcm in specific resistance, and the second layer was rendered 10 μm in film thickness and $1 \times 10^{-3}$ Ωcm in specific resistance.

Both of the conductive polycrystalline diamond films 1 and the insulating polycrystalline diamond film 6 were synthesized by filament CVD with methane and hydrogen as material gas. Further, trimethyl boron was employed as material gas for the conductive polycrystalline diamond films, so that B/C was 20000 ppm in the first layer and not more than ⅓ thereof in the second layer.

When conductive polycrystalline diamond films synthesized under the same conditions were analyzed by SIMS, it was found that boron was contained in the first layer by 8000 ppm, and boron was contained in the second layer by 100 ppm.

After formation of the conductive polycrystalline diamond films 1, a suction through hole 5 of about 0.5 mm in diameter was formed at the center of the substrate 2 by laser beam machining. After forming the suction through hole 5, four side surfaces of the substrate 2 were worked in taper shapes, the insulating polycrystalline diamond film 6 was rendered 0.1 μm in Rmax by lapping, and the conductive polycrystalline diamond films 1 were removed by 5 μm and finished into 0.2 μm in Rmax.

Further, Ti of 0.2 μm and Ni of 0.5 μm were coated on the conductive polycrystalline diamond films 1 as electrodes, and AgCdO worked into sheet shapes of 3 mm×3 mm×0.1 mm was heated to about 650° C. in a heating furnace and brazed thereon, for providing conductor films 4.

Further, a ceramic base 7 provided with a through vacuum tube for sucking a semiconductor chip on a central portion was prepared from silicon nitride, the substrate 2 was held by this and set plates 8 whose side surfaces were worked into taper shapes, and four portions were fixed with set screws 9. Through holes were provided in four portions on positions of the ceramic base 7 coming into contact with the substrate 2 and AgCdO was press-fitted into the interior for providing feed electrodes 10 and preparing the tool tip.

On this tool tip 460, evaluation similar to that in Concrete Example 1 was made using a feed holder 470 shown in FIG. 23A, FIG. 23B, FIG. 24A and FIG. 24B. FIG. 25 shows the results. Consequently, it became possible to improve flatness of a pressing surface.

The embodiments disclosed herein must be considered illustrative in all points and not restrictive. The scope of the present invention is shown not by the above description but the scope of claims for patent, and it is intended that all modifications within the meaning and the range equivalent to the scope of the claims for patent are included.

The present invention is advantageously applicable to a tool tip employed for packaging a semiconductor chip on a substrate and a bonding tool comprising the tool tip, and a control method for the bonding tool.

What is claimed is:

1. A bonding tool for bonding conductors onto a semiconductor chip, comprising a tool body having a forward end and a tool tip mounted on said forward end of said tool body;

wherein said tool tip comprises:

a substrate that is mainly composed of at least one material selected from the group consisting of polycrystalline diamond, Si, SiC, AlN, $Si_3N_4$, and single-crystalline diamond, and that has a mounting surface facing toward and mounted at least indirectly on said forward end of said tool body, a bonding surface facing opposite said mounting surface and adapted at least indirectly to carry out said bonding, and at least two side surfaces intersecting with said mounting surface and said bonding surface;

a vapor-synthesized conductive polycrystalline diamond film that is provided on said bonding surface, said mounting surface, or said at least two side surfaces of said substrate, and that has a specific resistance of at least $1 \times 10^{-4}$ Ωcm and less than $1 \times 10^3$ Ωcm and a film thickness of at least 0.1 μm and not more than 500 μm; and a metal film that is provided contacting at least a portion of said conductive polycrystalline diamond film, and that is adapted to introduce electrical power into said conductive polycrystalline diamond film.

2. The bonding tool according to claim 1, wherein said tool tip further has at least one suction hole passing therethrough from said bonding surface to said mounting surface.

3. The bonding tool according to claim 1, wherein said conductive polycrystalline diamond film comprises diamond and an impurity added to said diamond to impart a conductivity to said film.

4. The bonding tool according to claim 3, wherein said impurity is boron.

5. The bonding tool according to claim 4, wherein a content of said boron in said conductive polycrystalline diamond film is at least 100 ppm and not more than 50000 ppm.

6. The bonding tool according to claim 5, wherein said conductive polycrystalline diamond film includes a first conductive polycrystalline diamond layer that has a relatively higher content of said boron and that is arranged relatively closer to said substrate, and a second conductive polycrystalline diamond layer that has a relatively lower content of said boron and that is arranged on said first conductive polycrystalline diamond layer relatively farther from said substrate.

7. The bonding tool according to claim 1, wherein said conductive polycrystalline diamond film comprises polycrystalline diamond with a fault introduced therein to impart a conductivity to said film.

8. The bonding tool according to claim 7, wherein said fault has an sp2 structure.

9. The bonding tool according to claim 8, wherein said conductive polycrystalline diamond film exhibits a Raman spectrum with a ratio (sp2/sp3) of a maximum value of an sp2 peak of said spectrum relative to a maximum value of an sp3 peak of said spectrum being at least 0.5 and not more than 10.

10. The bonding tool according to claim 1, wherein a surface of said conductive polycrystalline diamond film has a surface roughness of at least 0.1 μm and not more than 10 μm.

11. The bonding tool according to claim 1, wherein said conductive polycrystalline diamond film is provided at least on said bonding surface, and wherein said tool tip further comprises a second polycrystalline diamond film that is arranged on said conductive polycrystalline diamond film, and that has a specific resistance of at least $10^5$ Ωcm and a film thickness of at least 1 μm and less than 1000 μm.

12. The bonding tool according to claim 1, wherein said mounting surface is at least substantially parallel to said bonding surface with a degree of parallelism within 0.1 μm relative to said bonding surface.

13. The bonding tool according to claim 1, wherein said metal film comprises a first metal layer arranged on said conductive polycrystalline diamond film and a second outermost surface metal layer, and wherein said outermost surface metal layer consists essentially of any of a pure metal selected from Au, Pt, Ag, Ni, Ta and Cr, or an alloy of at least two of Au, Pt, Ag, Ni, Ta and Cr, or a material selected from AgPd, a Pt—Ir alloy, and an oxide containing Ag and at least one of Cd, In, Sn, Zn and Cu, or a metal carbide containing Ag and W.

14. The bonding tool according to claim 1, wherein said metal film comprises at least four independently arranged metal film portions that are arranged at four separate locations on an outer peripheral portion of said conductive polycrystalline diamond film, so as to be adapted to introduce the electrical power into said outer peripheral portion of said conductive polycrystalline diamond film.

15. The bonding tool according to claim 1, wherein said conductive polycrystalline diamond film is provided on said bonding surface and at least partially on said side surfaces, and wherein said metal film is provided on portions of said conductive polycrystalline diamond film arranged on said side surfaces.

16. The bonding tool according to claim 15, wherein said conductive polycrystalline diamond film has a surface that is an exposed outer surface adapted to directly carry out said bonding.

17. The bonding tool according to claim 1, wherein said conductive polycrystalline diamond film is provided on said mounting surface, and said metal film is provided on said conductive polycrystalline diamond film with said diamond film directly between said mounting surface and said metal film.

18. The bonding tool according to claim 17, wherein said tool tip further comprises an electrically insulative diamond film arranged on said bonding surface of said substrate, wherein said insulative diamond film has a surface that is an exposed outer surface adapted to directly carry out said bonding.

19. The bonding tool according to claim 1, wherein said conductive polycrystalline diamond film is arranged on said bonding surface and at least partially on said side surfaces, said metal film is arranged on said mounting surface and said side surfaces and contacts at least an edge of portions of said conductive polycrystalline diamond film arranged on said side surfaces, and said tool tip further comprises an electrically insulative diamond film arranged on said conductive polycrystalline diamond film on said bonding surface.

20. The bonding tool according to claim 19, wherein said metal film overlaps and covers at least a part of said portions of said conductive polycrystalline diamond film arranged on said side surfaces.

21. A bonding tool for bonding conductors onto a semiconductor chip, comprising a feed holder having a forward end and a tool tip mounted on said forward end of said feed holder;

wherein said tool tip comprises:

a substrate that is mainly composed of at least one material selected from the group consisting of polycrystalline diamond, Si, SiC, AlN, $Si_3N_4$, and single-crystalline diamond, and that has a mounting surface facing toward and mounted at least indirectly on said forward end of said feed holder, a bonding surface facing opposite said mounting surface and adapted at least indirectly to carry out said bonding, and at least two side surfaces intersecting with said mounting surface and said bonding surface;

a vapor-synthesized conductive polycrystalline diamond film that is provided on said bonding surface, said mounting surface, or said at least two side surfaces of said substrate; and a metal film that is provided contacting at least a portion of said conductive polycrystalline diamond film, and that is adapted to introduce electrical power into said conductive polycrystalline diamond film; and wherein said feed holder comprises:

at least one metal electrode that contacts said metal film and is adapted to supply electrical power to said tool tip; and a ceramic base that supports said metal electrode.

22. The bonding tool according to claim 21, wherein said feed holder has a vacuum suction groove that faces said mounting surface of said tool tip and is adapted to hold said tool tip onto said feed holder by a vacuum suction, a suction through hole that communicates with and is adapted to apply said vacuum suction to said vacuum suction groove, at least two separate conductor films that contact said at least one metal electrode of said feed holder and said metal film of said tool tip, a first insulating ceramic part having a contact surface that contacts said tool tip facing said mounting surface and that has a surface flatness of less than 3 μm, a second insulating ceramic part that has a low heat conductivity, a metal part, and a protective metal film on a surface of said metal part, wherein said protective metal film is adapted to prevent oxidation of said surface of said metal part.

23. The bonding tool according to claim 22, wherein said protective metal film comprises an inner layer and an outermost surface layer, and wherein said outermost surface layer consists essentially of any of a pure metal selected from Au, Pt, Ag, Ni, Ta and Cr, or an alloy of at least two of Au, Pt, Ag, Ni, Ta and Cr, or a material selected from AgPd, a Pt—Ir alloy, and an oxide containing Ag and at least one of Cd, In, Sn, Zn and Cu, or a metal carbide containing Ag and W.

24. A method of operating a bonding tool having a tool tip including a conductive polycrystalline diamond film, comprising the following steps:

a) providing electrical power to said conductive polycrystalline diamond film so as to heat said diamond film;

b) during said step a), measuring an electrical resistance of said diamond film so as to determine a change of said electrical resistance; and c) responsive to and dependent on said change of said electrical resistance, adjusting said providing of said electrical power so as to control a temperature of said diamond film; and d) pressing said tool tip against conductors so as to bond said conductors onto a semiconductor chip.

* * * * *